(12) United States Patent (10) Patent No.: US 8,378,758 B2
Villanueva Torrijo et al. (45) Date of Patent: Feb. 19, 2013

(54) PARAMETRIC FEEDBACK OSCILLATORS

(75) Inventors: Luis Guillermo Villanueva Torrijo, Los Angeles, CA (US); Rassul Karabalin, Pomona, CA (US); Matthew Matheny, Diamond Bar, CA (US); Philip X.-L. Feng, Beachwood, OH (US); Michael C. Cross, Claremont, CA (US); Michael L. Roukes, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 117 days.

(21) Appl. No.: 13/095,692

(22) Filed: Apr. 27, 2011

(65) Prior Publication Data

US 2011/0260802 A1 Oct. 27, 2011

Related U.S. Application Data

(60) Provisional application No. 61/328,585, filed on Apr. 27, 2010.

(51) Int. Cl.
*H03B 5/36* (2006.01)
(52) U.S. Cl. ............... 331/156; 331/154; 331/116 R
(58) Field of Classification Search ............ 331/156, 331/154, 116 R
See application file for complete search history.

(56) References Cited

U.S. PATENT DOCUMENTS

| | | | |
|---|---|---|---|
| 6,515,751 B1 | 2/2003 | Craighead | |
| 7,724,103 B2 | 5/2010 | Feng et al. | |
| 8,228,130 B1 * | 7/2012 | Ivanov et al. | 331/116 M |
| 2009/0278619 A1 * | 11/2009 | Partridge et al. | 331/154 |

OTHER PUBLICATIONS

Hajimiri, A., et. al., "A general theory of phase noise in electrical oscillators," Solid-State Circuits, IEEE Journal of, vol. 33, No. 2, pp. 179-194, Feb. 1998.
Zalalutdinov, M., et. al., Autoparametric optical drive for micromechanical oscillators, Applied Physics Letters, vol. 79, Issue 5, Jul. 30, 2001.
Ron Lifshitz, et. al., Nonlinear Dynamics of Nanomechanical and Micromechanical Resonators, Review of Nonlinear Dynamics and Complexity, Edited by Heinz Georg Schuster (Wiley, Mar. 5, 2008).
Cross, M. C., et. al., Synchronization by Nonlinear Frequency Pulling, Physical Review Letters, vol. 93, Issue 22, Nov. 2004.
Cross, M. C., et. al., Synchronization by reactive coupling and nonlinear frequency pulling, Physical Review E, vol. 73, Issue 3, Mar. 6, 2006.
Rongrui He, et. al., Self-Transducing Silicon Nanowire Electromechanical Systems at Room Temperature, Nano Letters, vol. 8, issue 6, pp. 1756-1761, May 16, 2008.

(Continued)

*Primary Examiner* — Joseph Chang
(74) *Attorney, Agent, or Firm* — Milstein Zhang & Wu LLC; Joseph B. Milstein

(57) ABSTRACT

A parametric feedback oscillator includes a resonator which has at least one transduction element and at least one electromechanical resonating element. The resonator is configured to accept as input a parametric excitation signal at a frequency $2\omega_0$ and to provide a resonating output signal at a frequency $\omega_0$. A cascaded feedback path in any electrically coupled cascade order includes at least one non-linear element, at least one phase shifter electrically, and at least one amplifier. The cascade feedback path is configured to receive as input the resonating output signal at a frequency $\omega_0$ and configured to provide as output a feedback path signal as the parametric excitation signal at a frequency $2\omega_0$ to the resonator. A parametric feedback oscillator output terminal is configured to provide the resonating output signal at the frequency $\omega_0$ as an output signal. A method of causing a parametric feedback oscillation is also described.

33 Claims, 33 Drawing Sheets

OTHER PUBLICATIONS

N Kacem, et. al., Nonlinear dynamics of nanomechanical beam resonators: improving the performance of NEMS-based sensors, Nanotechnology vol. 20 No. 27, Jun. 16, 2009.

Karabalin, R. B., et. al., Parametric Nanomechanical Amplification at Very High Frequency, Nano Letters, vol. 9, issue 9, pp. 3116-3123, Aug. 4, 2009.

Karabalin, R. B., et. al., Piezoelectric nanoelectromechanical resonators based on aluminum nitride thin films, Applied Physics Letters, vol. 95, Issue 10, (3 pages) Sep. 9, 2009.

Karabalin, R. B., et. al., Efficient parametric amplification in high and very high frequency piezoelectric nanoelectromechanical systems, Appl. Phys. Lett. 97, Nov. 7, 2010.

Kozinsky, I., et. al., Tuning nonlinearity, dynamic range, and frequency of nanomechanical resonators. Applied Physics Letters, 88 (25) Jun. 19, 2006.

Sotiris C. Masmanidis, et al., Multifunctional Nanomechanical Systems via Tunably Coupled Piezoelectric, Actuation Science 317, 780 Aug. 10, 2007.

Nichol, John M., et. al., Controlling the nonlinearity of silicon nanowire resonators using active feedback, Applied Physics Letters, vol. 95, Issue 12, (3 pages) Sep. 24, 2009.

Rugar, D., et. al., Mechanical parametric amplification and thermomechanical noise squeezing, Physical Review Letters, vol. 67, Aug. 5, 1991, p. 699-702.

Greywall, D. S., et. al., Evading amplifier noise in nonlinear oscillators, Physical Review Letters, vol. 72, Issue 19, May 9, 1994, pp. 2992-2995.

Yurke, B., et. al., Theory of amplifier-noise evasion in an oscillator employing a nonlinear resonator, Physical Review A (Atomic, Molecular, and Optical Physics), vol. 51, Issue 5, May 1995, pp. 4211-4229.

\* cited by examiner

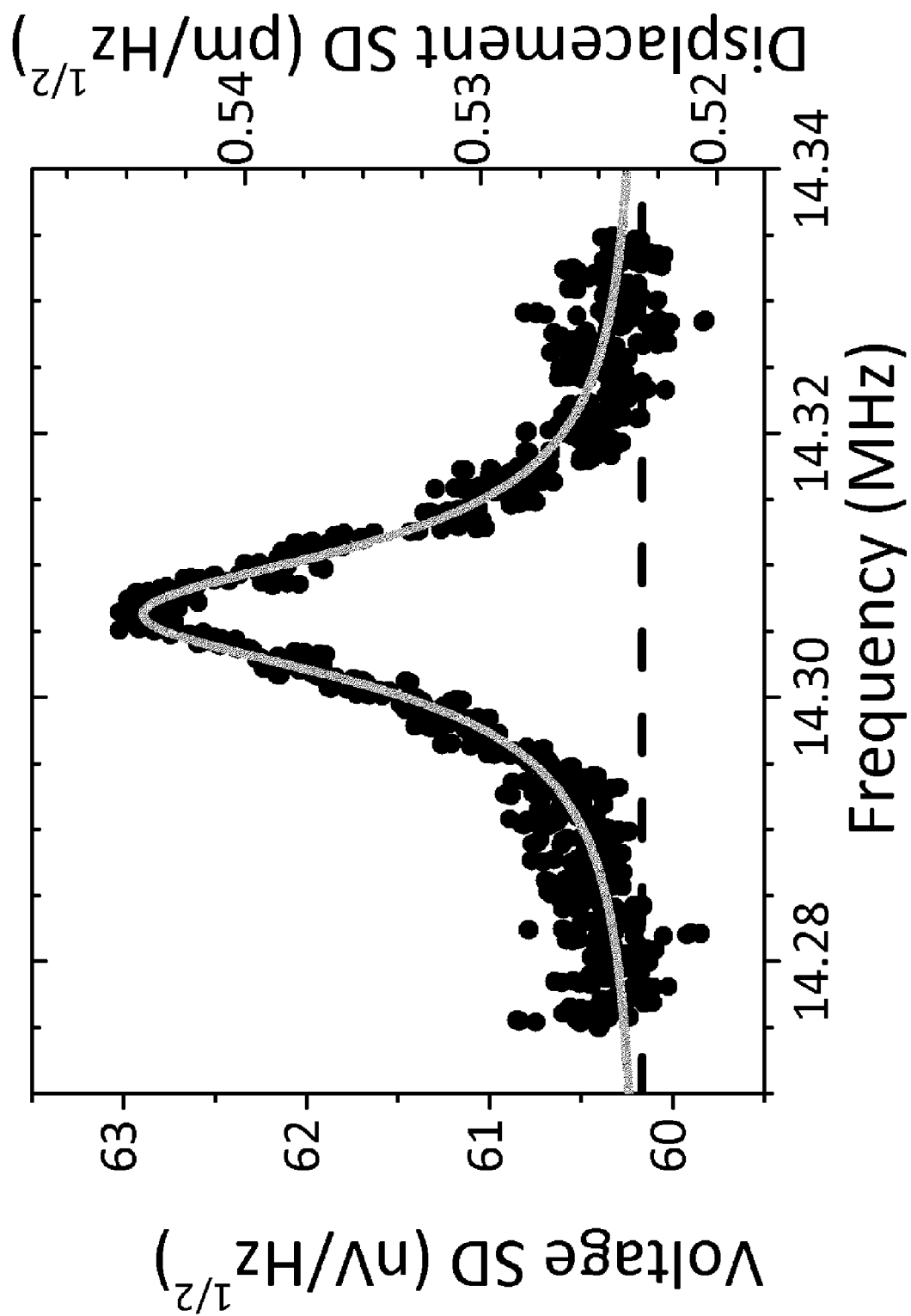

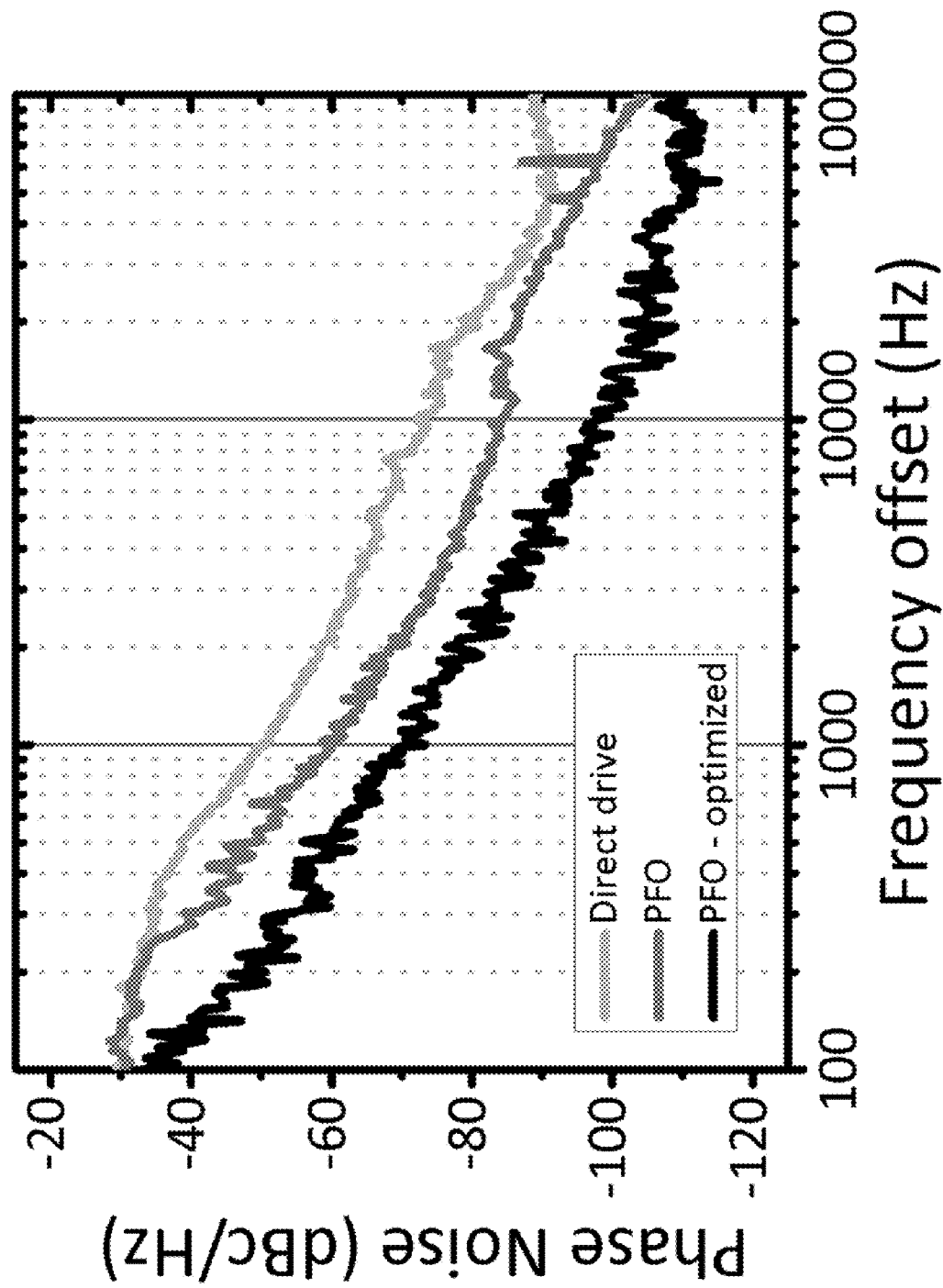

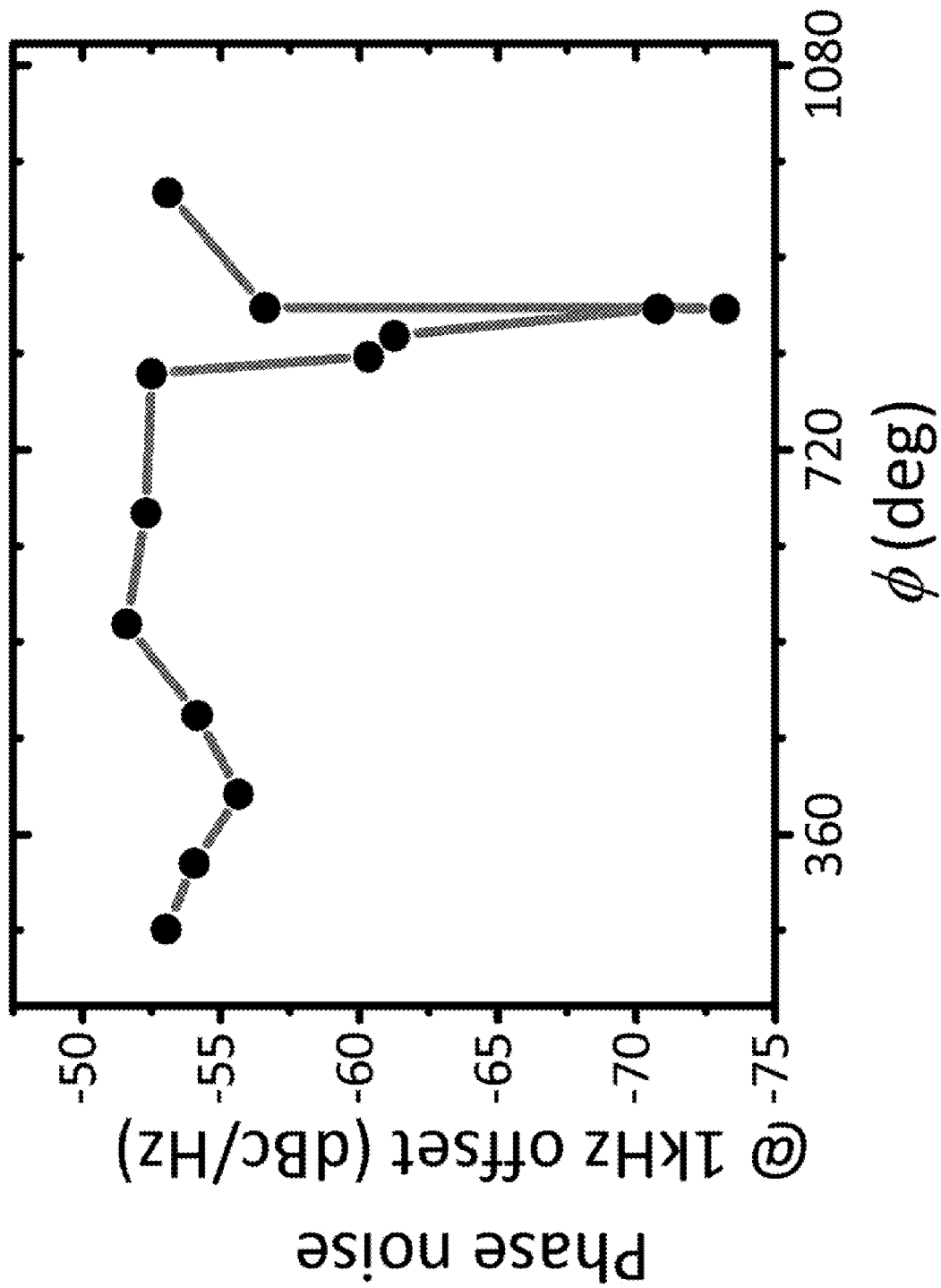

PARAMETRIC FEEDBACK OSCILLATORS

CROSS-REFERENCE TO RELATED APPLICATIONS

This application claims priority to and the benefit of U.S. provisional patent application Ser. No. 61/328,585, filed Apr. 27, 2010, which application is incorporated herein by reference in its entirety.

FIELD OF THE INVENTION

The invention relates to oscillators in general and particularly to an oscillator that employs feedback.

BACKGROUND OF THE INVENTION

Oscillators are used in a range of applications from reference clocks and frequency references, to distance measurements (e.g., RADAR) and radio technologies. An oscillator is a device that provides an AC output signal at a given frequency in response to an input DC power. Once powered, a self-sustained oscillator continues to oscillate until the power is removed. A resonating system with a positive feedback is typically used to make a self-sustained oscillator. A resonating stage with a positive feedback creates a non linear system which maintains oscillations at a given frequency ($w\omega_0$) and given amplitude ($A_{osc}$).

FIG. 1 shows a block diagram of an exemplary prior art self-sustained oscillator. The thermal motion of the resonator is amplified and its phase is corrected to provide a feedback signal that drives the resonator. When the gain of the amplifier is sufficiently large to compensate for the intrinsic damping of the resonator and for losses due to the transduction technique (e.g., electrical to mechanical and mechanical to electrical), the system starts to self-oscillate. Typically, the only input an oscillator uses is DC power in order to bias the one or more internal amplifiers that provide the feedback gain. Finally, the motion of the resonator can be converted to an electrical signal by a transducer. The electrical signal can then be used for frequency sources, clocks, or other applications.

A resonator exhibiting a large quality factor (Q) can provide a more stable oscillator. With their large Q, mechanical resonators, such as those made from quartz crystals, micro electro-mechanical systems (MEMS), or nano electro-mechanical systems (NEMS) are particularly well suited for use in oscillators.

There is a need for more stable, more efficient, and lower noise oscillators.

SUMMARY OF THE INVENTION

According to one aspect, the invention features a parametric feedback oscillator which includes a power input terminal configured to accept a source of electrical power. A resonator has at least one transduction element and at least one electromechanical resonating element. The electromechanical resonating element is configured to accept as input a parametric excitation signal at a frequency $2\omega_0$ and to provide a resonating output signal at a frequency $\omega_0$. A cascaded feedback path in any electrically coupled cascade order includes at least one non-linear element disposed within the cascaded feedback path and coupled to the resonator. The non-linear element is configured to receive the resonating output signal at ($\omega_0$ and configured to provide a non-linear element output signal at a frequency $2\omega_0$. The cascaded feedback path in any electrically coupled cascade order also includes at least one phase shifter electrically disposed within the cascaded feedback path. The phase shifter is configured to receive a phase shifter input signal and configured to provide a phase shifted output signal relative to the phase shifter input signal. The cascaded feedback path in any electrically coupled cascade order also includes at least one amplifier electrically disposed within the cascaded feedback path. The amplifier is configured to receive an amplifier input signal and configured to provide an amplifier output signal including an amplified signal relative to the amplifier input signal, and configured to accept electrical power from the power input terminal. The cascade feedback path is configured to receive as input the resonating output signal at a frequency $\omega_0$ and configured to provide as output a feedback path signal as the parametric excitation signal at a frequency $2\omega_0$ to the resonator. A parametric feedback oscillator output terminal is configured to provide the resonating output signal at the frequency $\omega_0$ as an output signal.

In one embodiment, the parametric feedback oscillator is configured to operate substantially at a flattening point.

In another embodiment, the parametric feedback oscillator further includes an all pass filter.

In yet another embodiment, the at least one non-linear element includes a frequency doubler.

In yet another embodiment, the parametric feedback oscillator further includes a directional coupler electrically disposed between the resonator and the at least one non-linear element. The directional coupler has a directional coupler input terminal and a first directional coupler output terminal and a second directional coupler output terminal, the directional coupler input terminal electrically coupled to the resonator. The first directional coupler output terminal is configured as a parametric feedback oscillator output terminal, and the second directional coupler output terminal is electrically coupled to the non-linear element.

In yet another embodiment, the resonator includes a resonator selected from the group consisting of a microelectromechanical resonator and a nanoelectromechanical resonator.

In yet another embodiment, the resonator includes at least one beam of a type selected from the group consisting of a clamped-clamped beam, a clamped-free beam, a free-free beam, a square plate resonator, a disk resonator, and a ring resonator.

In yet another embodiment, the resonator includes a plurality of beams.

In yet another embodiment, the beam includes at least one of a metal, a semiconductor, an insulator, and a piezoelectric.

In yet another embodiment, the beam includes a material selected from the group of materials consisting of multi-stack of metal-piezoelectric-metal, aluminum, gold, platinum, silicon, silicon nitride, silicon carbide, silicon oxide, molybdenum, aluminum nitride, gallium arsenide, aluminum gallium arsenide, gallium nitride, lithium niobate, sodium niobate, lithium tantalate, carbon, zinc oxide, boron nitride, piezoceramic materials (such as lead zirconate titanate, PZT), graphene, and carbon nanotubes.

In yet another embodiment, the resonator is configured to be set in motion by dynamically modulating at least one physical parameter selected from the group consisting of frequency, elastic constant, and mass.

In yet another embodiment, the dynamic modulation is selected from the group consisting of an actuation effect, a mechanical effect and a geometric effect.

In yet another embodiment, the mechanical effect is a selected one of a material stress and a material property.

In yet another embodiment, the geometric effect includes a change in the geometry or the size of the resonator.

In yet another embodiment, an actuation nonlinearity effect includes a selected one of optical actuation nonlinearity effect tuning and capacitive actuation nonlinearity effect tuning. In yet another embodiment, the at least one non-linear element includes a selected one of a digital technology, an analog non-linear element, and combination thereof.

In yet another embodiment, the at least one non-linear element is disposed within the resonator.

In yet another embodiment, the at least one non-linear element includes a selected one of a readout transduction element and an actuator transduction element.

In yet another embodiment, the at least one non-linear element comprises a signal transducer selected from the group consisting of magnetomotive, capacitive, optical, electrostatic, piezoresistive and piezoelectric transducers.

In yet another embodiment, the at least one non-linear element includes a signal transducer having a quadratic dependence.

In yet another embodiment, the at least one non-linear element includes an analog non-linear device.

In yet another embodiment, the analog non-linear device includes a selected one of a diode and a saturated amplifier.

In yet another embodiment, the parametric feedback oscillator further includes at least one high order filter configured to suppress harmonics other than the $2\omega_0$ harmonic.

In yet another embodiment, the parametric feedback oscillator is fabricated by a selected one of a micro-fabrication process and a nano-fabrication process.

In yet another embodiment, the parametric feedback oscillator is fabricated by a selected one of a CMOS process and BiCMOS process.

In yet another embodiment, the parametric feedback oscillator includes multiple feedback loops.

In yet another embodiment, the parametric feedback oscillator is configured to adjust at least a selected one of a nonlinear stiffness term and a nonlinear damping term.

In yet another embodiment, the parametric feedback oscillator is configured as a selected one of a voltage controlled oscillator, a frequency source, a clock, and a high dynamic range sensor.

According to another aspect, the invention features a method of causing a parametric feedback oscillation in a nanoelectromechanical resonator including the steps of: providing a nanoelectromechanical resonator, a frequency doubler, and an amplifier electrically coupled in a closed loop, the amplifier configured to provide an amplified doubled frequency feedback signal of an output frequency of the nanoelectromechanical resonator to an input of the nanoelectromechanical resonator; oscillating the nanoelectromechanical resonator at a frequency $\omega_0$; doubling the frequency $\omega_0$ to create a $2\omega_0$ feedback signal using the frequency doubler; amplifying the $2\omega_0$ feedback signal; and applying the amplified $2\omega_0$ feedback signal to the nanoelectromechanical resonator at a frequency $2\omega_0$ to cause a self sustained parametric feedback oscillation at the frequency $w_0$.

In one embodiment, the method of causing a parametric feedback oscillation in a nanoelectromechanical resonator further includes the step of tuning the frequency $\omega_0$ using a tuning method selected from the group of tuning methods consisting of piezoelectric tuning, thermal tuning, and tuning by application of an externally applied axial force.

In another embodiment, the nanoelectromechanical resonator includes a transduction element which uses a selected one of non-linear capacitive actuation and non-linear $2\omega$ piezoresistive detection.

According to yet another aspect, the invention features a parametric feedback oscillator which includes a resonator having a resonator input terminal and a resonator output terminal The resonator has at least one transducer element. A directional coupler has a directional coupler input terminal, a first directional coupler output terminal and a second directional coupler output terminal, the directional coupler input terminal electrically coupled to the resonator output terminal. A frequency doubler has a frequency doubler output terminal The frequency doubler is coupled to the resonator via a selected one of an electromechanical connection via the transducer element and an electrical connection to the resonator output terminal A phase shifter has a phase shifter input terminal and a phase shifter output terminal. The phase shifter input terminal is electrically coupled to the frequency doubler output terminal. An amplifier has an amplifier input terminal and an amplifier output terminal. The amplifier input terminal is electrically coupled to the phase shifter output terminal, and the amplifier output terminal electrically is coupled to the resonator input terminal. At least one power terminal and one common terminal, the power terminal are configured to accept a source of electrical power. The resonator is configured to oscillate at a frequency $\omega_0$ in response to a feedback signal at $2\omega_0$ and the parametric feedback oscillator configured to generate an output signal having a frequency $\omega_0$.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 10C shows a graph of voltage spectral density plotted versus frequency, which illustrates the background (system) noise and the thermomechanical peak of the resonator.

FIG. 12E shows a graph of phase noise measurements of a direct drive oscillator and of an exemplary PFO at two different operational points.

FIG. 12F shows a graph of the phase noise at a 1 kHz offset as a function of phase.

FIG. 13A shows the results of the step of depositing an Al thin layer via lift-off with PMMA and performing a dry etching of Mo with $SF_6$.

FIG. 13B shows results of the step of using KOH to remove Al and AlN simultaneously using Mo as a mask for the latter.

FIG. 13C shows the results of a two step process using ZEP as a mask and $SF_6$ as the etching species.

FIG. 13D shows the results of the step of patterning the mechanical devices using a strontium fluoride ($SrF_2$) mask and chlorine dry etching of the stack.

FIG. 13E shows the results of the step of adding a contact the top Mo on the mechanical devices, where we deposit $SrF_2$ isolation "bridges" and, subsequently perform a lift-off of Au, also defining our contact pads.

FIG. 13F shows the results of the step of releasing the mechanical structures via a wet etching using buffered HF.

DETAILED DESCRIPTION

Resonators can be excited parametrically according to principles of the invention. Parametric excitation is the modulation of a characteristic parameter (for example, an elastic constant) of the resonator at a frequency which is an integer fraction of twice its natural frequency (for example, twice its natural frequency). Such modulation, under certain conditions, can excite mechanical vibrations. When a parametric drive is applied to the resonator, the noise is "squeezed" into two quadrants of the phase and amplified in the other two, the phase being determined relatively to the external signal that performs the parametric excitation. In addition, the width of the resonator peak can be substantially reduced, such as by orders of magnitude.

Figure 2A:
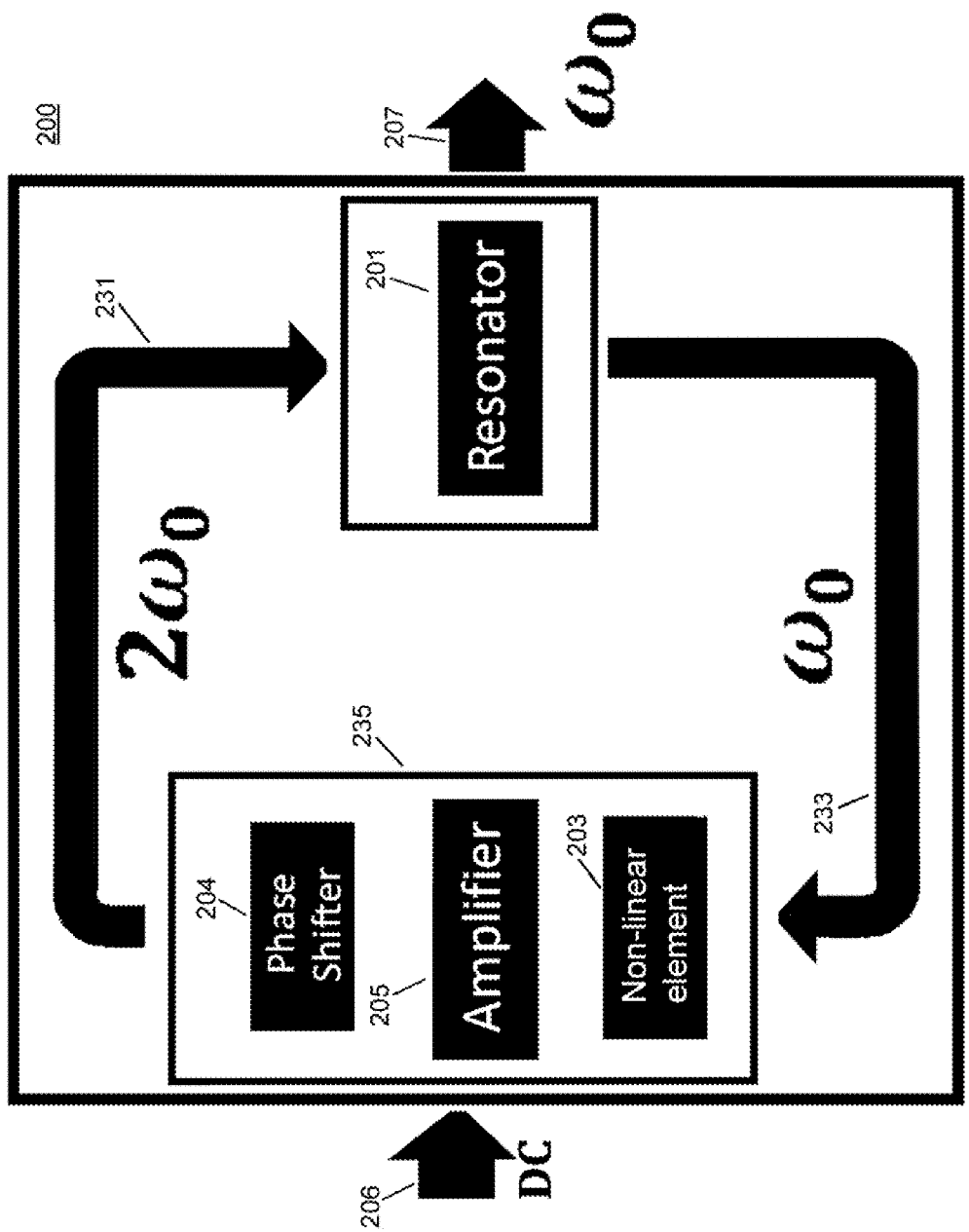
FIG. 2A shows a block diagram of an exemplary parametric feedback oscillator according to the invention.

FIG. 2A shows a block diagram 200 of one exemplary parametric feedback oscillator (PFO). Parametric feedback oscillator 100 includes a power input terminal (FIG. 2D, terminal 251) configured to accept a source of electrical power 206. A resonator 201 has at least one transduction element 211 (FIG. 2C) and at least one electromechanical resonating element (FIG. 2C). The resonator 201 is configured to accept as input a parametric excitation signal at a frequency $2\omega_0$ and to provide a resonating output signal at a frequency $\omega_0$. A cascaded feedback path 235 includes in any electrically coupled cascade order: a non-linear element 203 disposed within the cascaded feedback path and coupled to resonator 201. The non-linear element 203 is configured to receive a resonating output signal at $\omega_0$ and configured to provide a non-linear element output signal at a frequency $2\omega_0$. As is discussed in more detail hereinbelow, non-linear element 203 can be included in a transducer that is attached to resonator 201 or can be a separate element not necessarily physically coupled to resonator 201. Non-linear element 203 can be based on a non-linear circuit element which may or may not use power from the power terminal or non-linear element 203 can be an active circuit which does use power supplied via the power terminal A phase shifter 204 is electrically disposed within the cascaded feedback path 235. The phase shifter 204 is configured to receive a phase shifter input signal and configured to provide a phase shifted output signal relative to the phase shifter input signal. Phase shifter 204 can include a passive circuit element (e.g., a transmission line delay), or an active electronic circuit or any suitable combination thereof. An amplifier 205 is electrically disposed within the cascaded feedback path 235. Amplifier 205 is configured to receive an amplifier input signal and configured to provide an amplifier output signal including an amplified signal relative to the amplifier input signal. Amplifier 205 is typically an active electronic circuit configured to accept electrical power from said power input terminal. The cascade feedback path 235 is configured to receive as input the resonating output signal at a frequency $\omega_0$ and configured to provide as output a feedback path signal as said parametric excitation signal at a frequency $2\omega_0$ to the resonator. A parametric feedback oscillator output terminal 207 is configured to provide a resonating output signal at said frequency $\omega_0$ as an output signal.

The phrase "any electrically coupled cascade order" is defined to mean that the recited elements of the cascaded feedback path 235, in which (a) represents at least one non-linear element, in which (b) represents at least one phase shifter, and in which (c) represents at least one amplifier, can appear in any order. For example, the three elements (a), (b) and (c) can be connected in the order of (a)(b)(c), (a)(c)(b), (b)(c)(a), (b)(a)(c), (c)(a)(b), or (c)(b)(a). In addition, "any electrically coupled cascade order" includes embodiments where there are other elements disposed between two of the elements (a), (b) and (c). For example, it is understood that there could be a signal conditioning element between any two elements (e.g., a bandpass filter or other frequency selective element). It is also understood that there can be multiple instances of the basic elements. For example, there could be a cascaded feedback path which includes elements (a), (b), and (c) with some duplication as follows: (c)(a)(c)(b)(c).

Figure 2B:
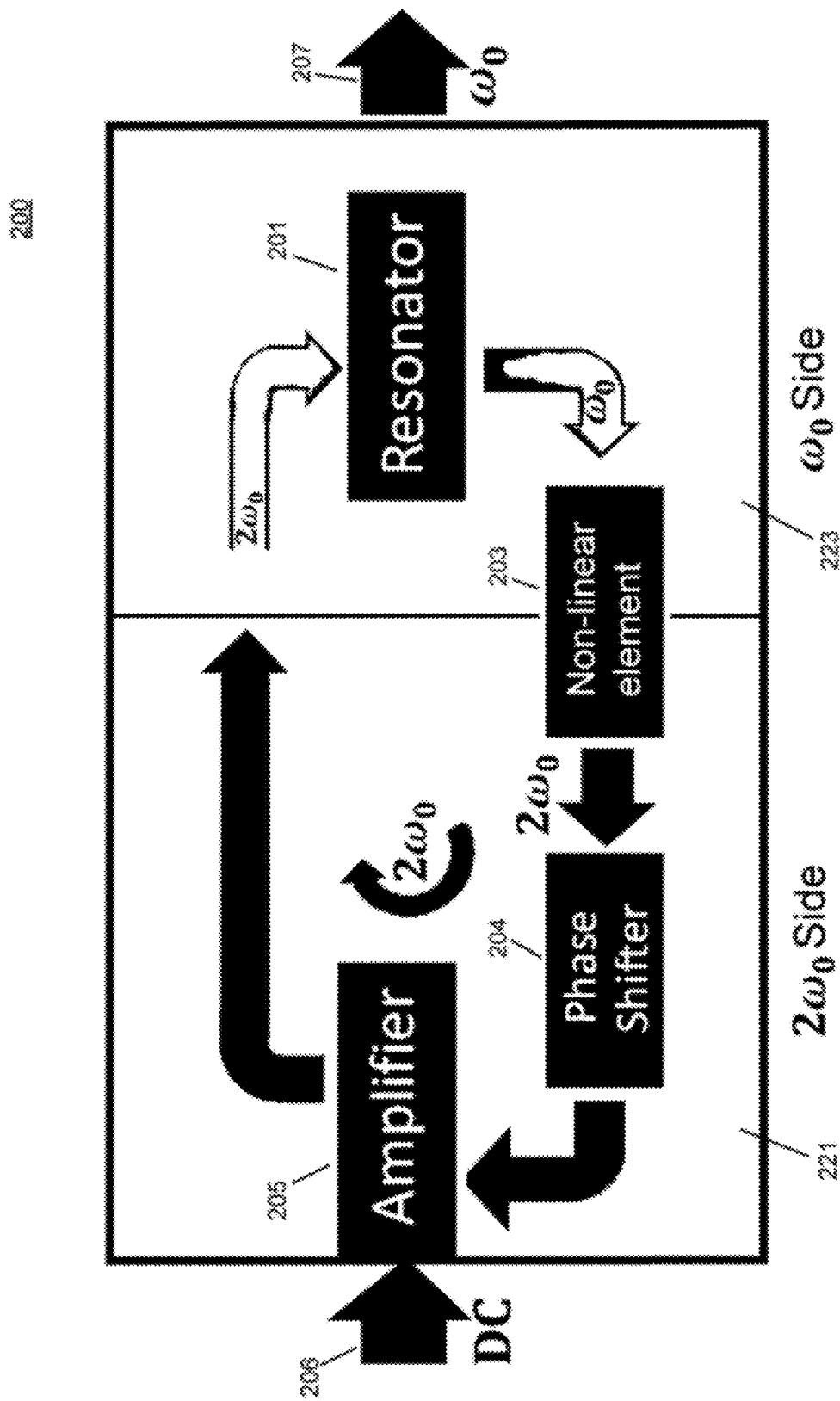
FIG. 2B shows a block diagram of another exemplary parametric feedback oscillator according to the invention.
Figure 2C:
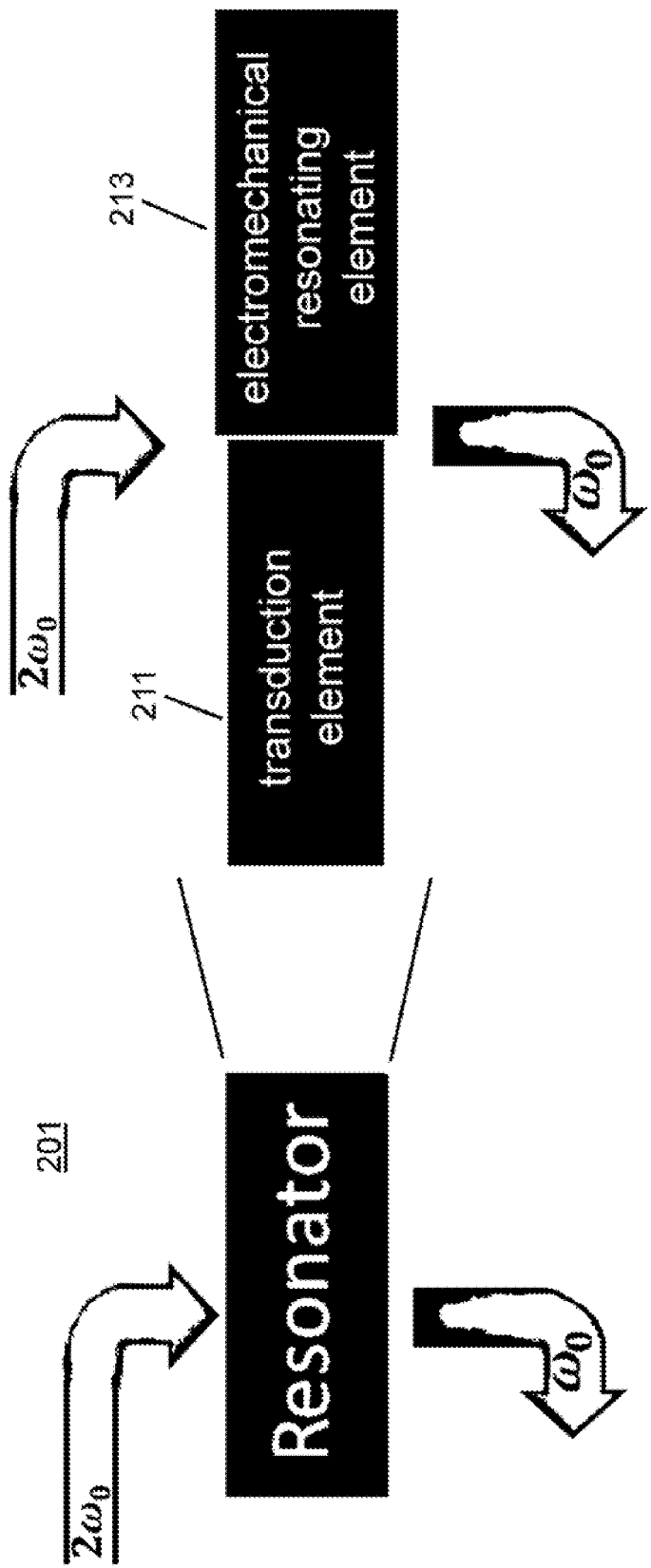
FIG. 2C shows a block diagram of one exemplary resonator having a transduction element and an electromechanical resonating element.
Figure 2D:
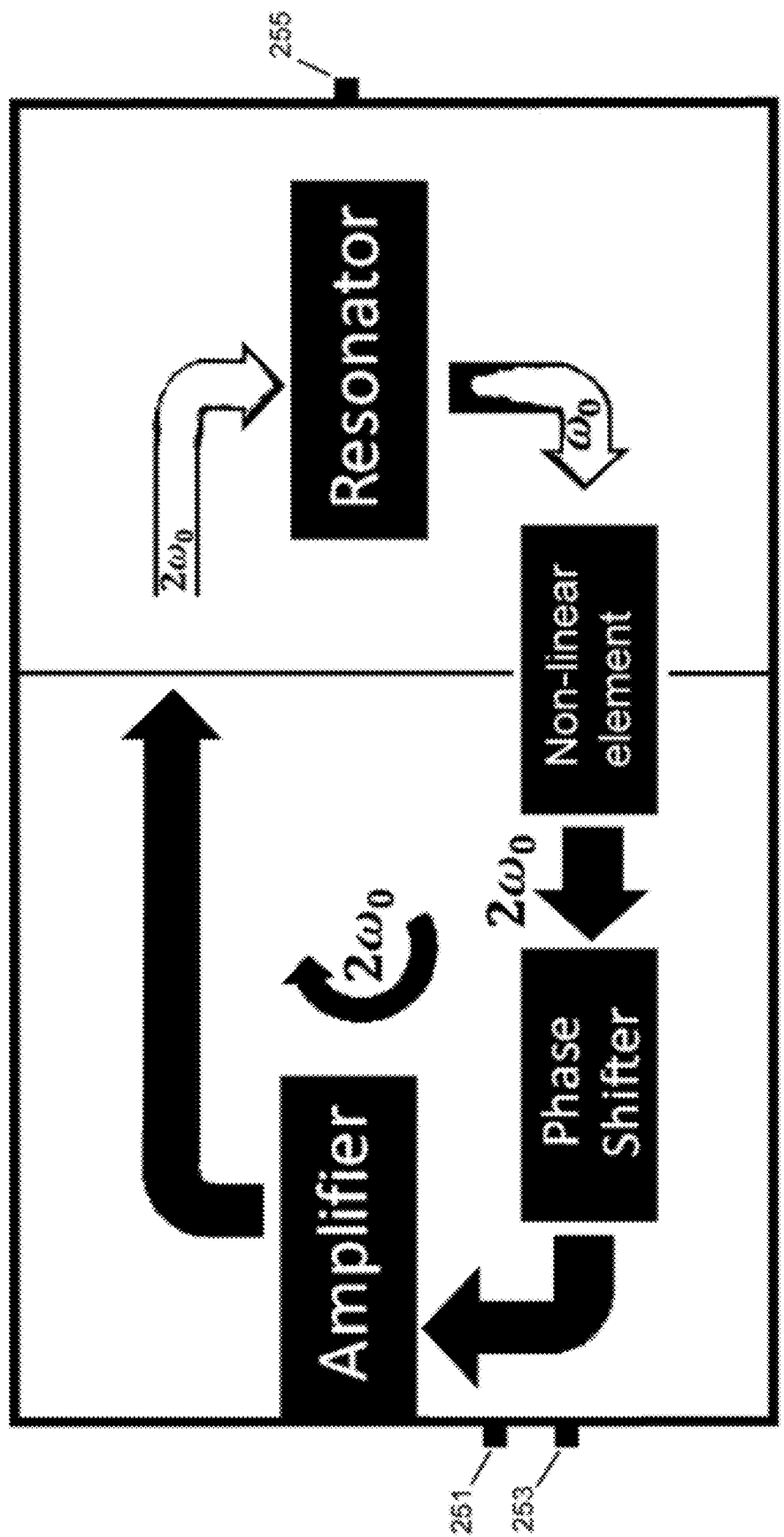
FIG. 2D shows a parametric feedback oscillator with exemplary connection terminals.

FIG. 2B shows a block diagram of another embodiment of a parametric feedback oscillator 200 according to the invention. We describe a parametric feedback oscillator 200 generally in terms of two sides, a $\omega_0$ side 223 and a two ($\omega_{0\ (2\omega 0)}$) side 221. The $\omega_0$ side 223 includes a resonator 201. FIG. 2C shows a block diagram of one exemplary resonator 201 having at least one transduction element 211 and at least one electromechanical resonating element 213. The resonator 201 is configured to provide a signal at $\omega_0$.

Returning to FIG. 2B, a non-linear element 203 is coupled to resonator 201. The non-linear element 203 is configured to receive an input signal at $\omega_0$ and to provide an output signal at $2\omega_0$. In the generalized representation of FIG. 2B, the non-linear element 203 is shown as overlapping the $\omega_0$ side 223 and the two ($\omega_0$ ($2\omega_0$) side 221. In various embodiments, non-linear element 203, can be disposed on $\omega_0$ side 223, such as by a combined function in the transduction element 211, or on the $2\omega_0$ side 221, for example as an analog electronic circuit.

The $2\omega_0$ side 221 includes a phase shifter 204 which is electrically coupled to the non-linear element 203. The phase shifter 204 is configured to receive the $2\omega_0$ signal from the non-linear element 203 at an input terminal and to provide a phase-shifted $2\omega_0$ signal to an amplifier 205 which is electrically coupled to an output terminal of phase shifter 204. Amplifier 205 is configured to receive the phase-shifted $2\omega_0$ signal from phase shifter 204 and to provide an amplified phase-shifted $2\omega_0$ signal to resonator 201. A parametric feedback oscillator output terminal (FIG. 2D, terminal 255) is configured to provide a output signal 207 at a frequency $\omega_0$.

A parametric feedback oscillator 200 also includes an input terminal (FIG. 2D, terminal 251) configured to accept a DC signal from a source of electrical power 206. There can optionally be a second terminal (FIG. 2D, terminal 253) configured as a common terminal or a terminal set to some other voltage than common with respect to the source of electrical power 206. A common or other reference voltage can also be applied via a substrate or other suitable connection (not shown).

Implementation

Figure 3:
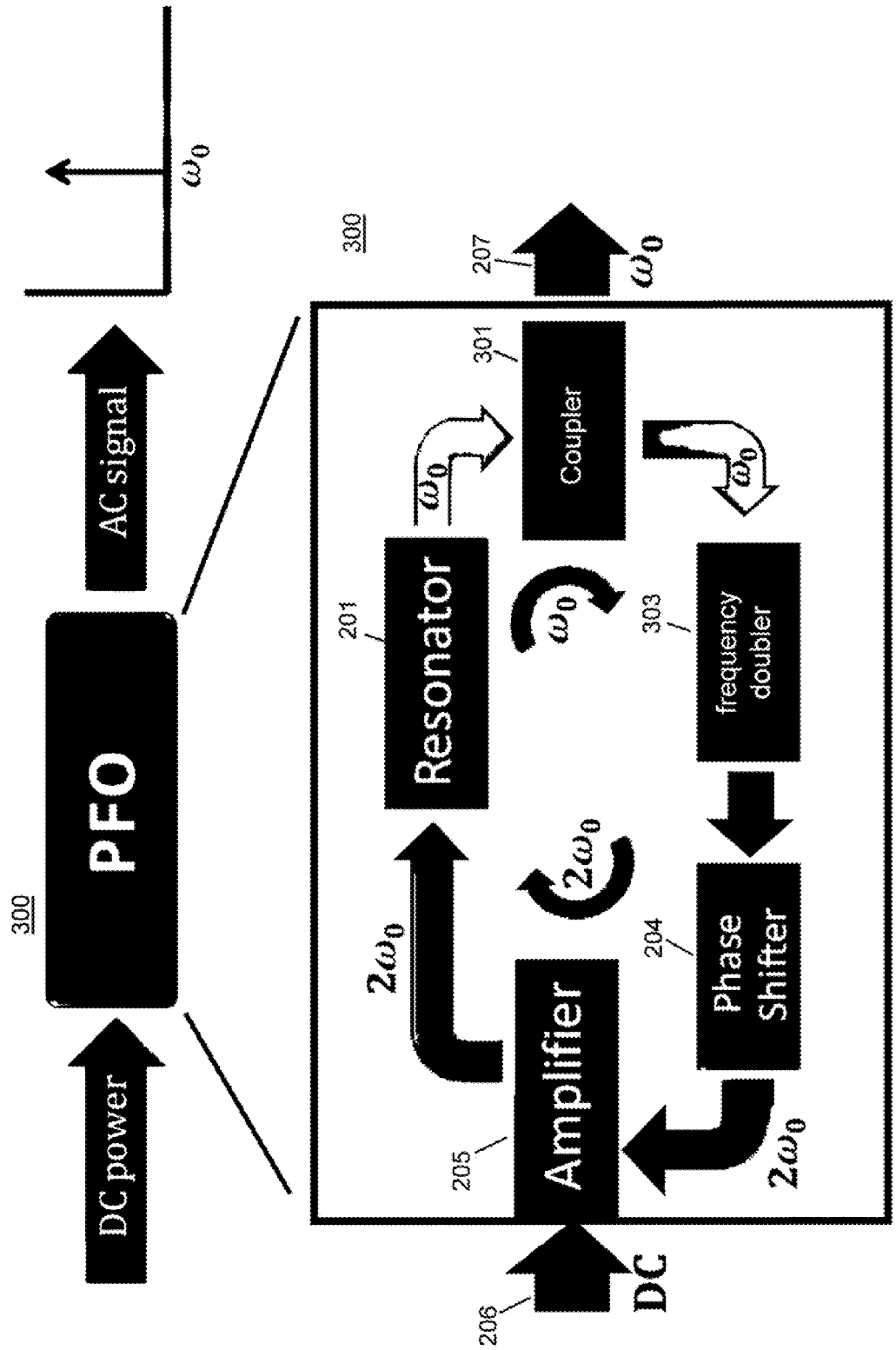
FIG. 3 shows a block diagram of another exemplary embodiment of a parametric feedback oscillator according to the invention.

FIG. 3 shows a block diagram of one exemplary embodiment of a parametric feedback oscillator (PFO) 300 according to the invention. The frequency of an electrical signal provided by a transducer, at a frequency $\omega_0$, is doubled by means of frequency doubler 303 (a non-linear element). After the appropriate adjustment of phase by phase shifter 204 and gain by amplifier 205, the $2\omega_0$ signal is fed-back to resonator 201 as a parametric excitation. As in the case of a standard linear oscillator (e.g., the oscillator of FIG. 1), a source of DC power 206 provides the start-up energy required to initiate oscillation and thereafter compensates for intrinsic losses in the resonator and transduction losses. Coupler 301 is typically a directional coupler. Output signal 207, at a frequency $\omega_0$, is depicted by an arrow.

Feedback

Figure 1:
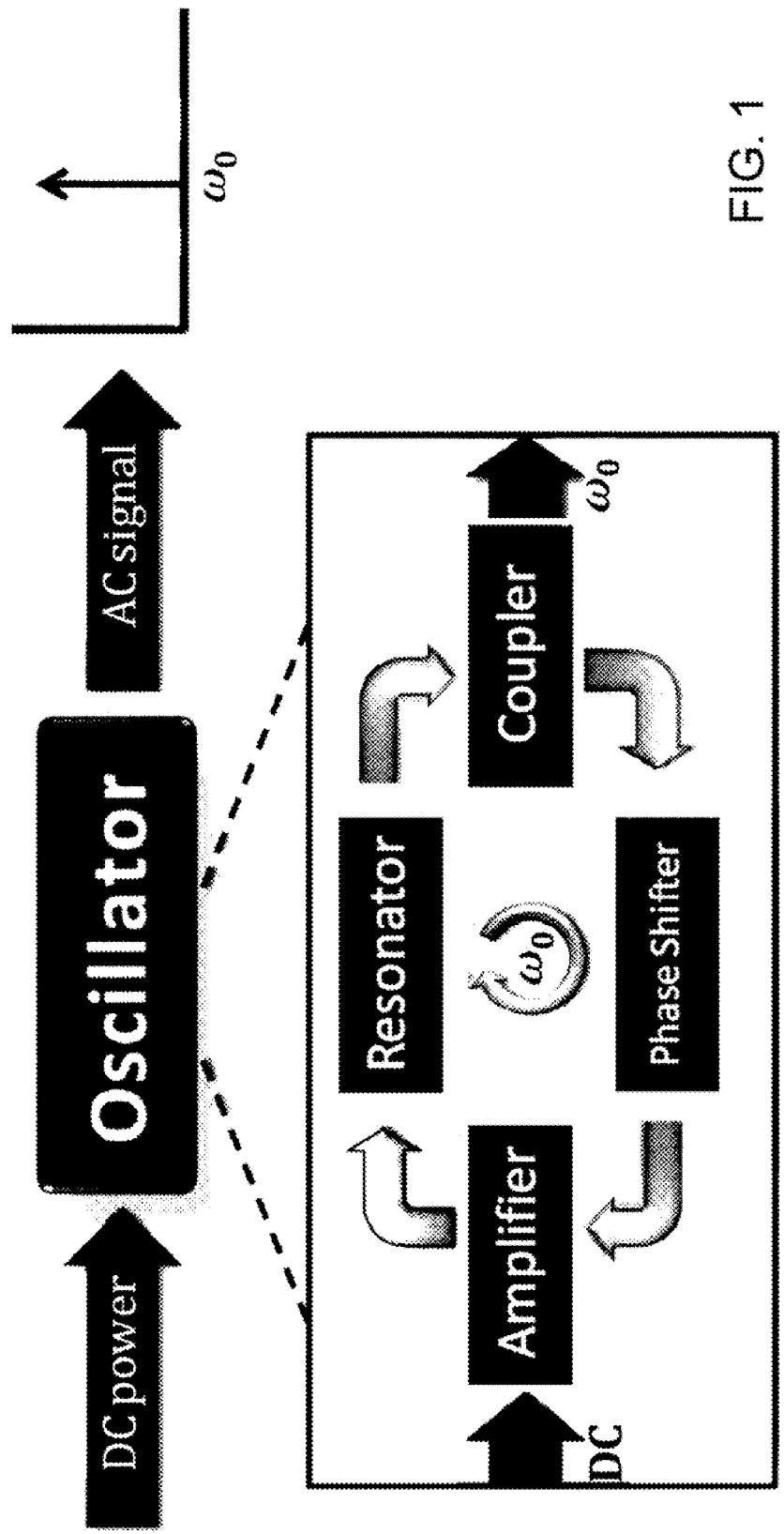
FIG. 1 shows a block diagram of a prior art oscillator.

One difference between the inventive parametric feedback oscillator as shown in FIG. 2A, FIG. 2B, and FIG. 3 and a prior art oscillator (as shown in FIG. 1) is that the feedback signal of a parametric feedback oscillator is at twice the oscillator frequency, $2\omega_0$, while the feedback signal in the prior art oscillator is at the oscillator frequency $\omega_0$. A frequency doubler 303 can be implemented in the feedback loop to provide the $2\omega_0$ feedback signal. The frequency doubler 303 can be any of a digital device or analog device, or some combination thereof, far from the resonator. Alternatively, a frequency doubler 303 can be implemented directly within the resonator transduction, either in the actuation or detection/conversion aspect of transduction, or both.

In some embodiments, frequency doubler 303 can be a digital frequency doubler. A digital frequency doubler 303 can provide a relatively clean and noiseless solution in comparison to an analog frequency doubler 303. However, with current fabrication technologies, a digital frequency doubler might be less suitable for applications having operating frequencies higher than about 1 GHz.

Figure 4A:
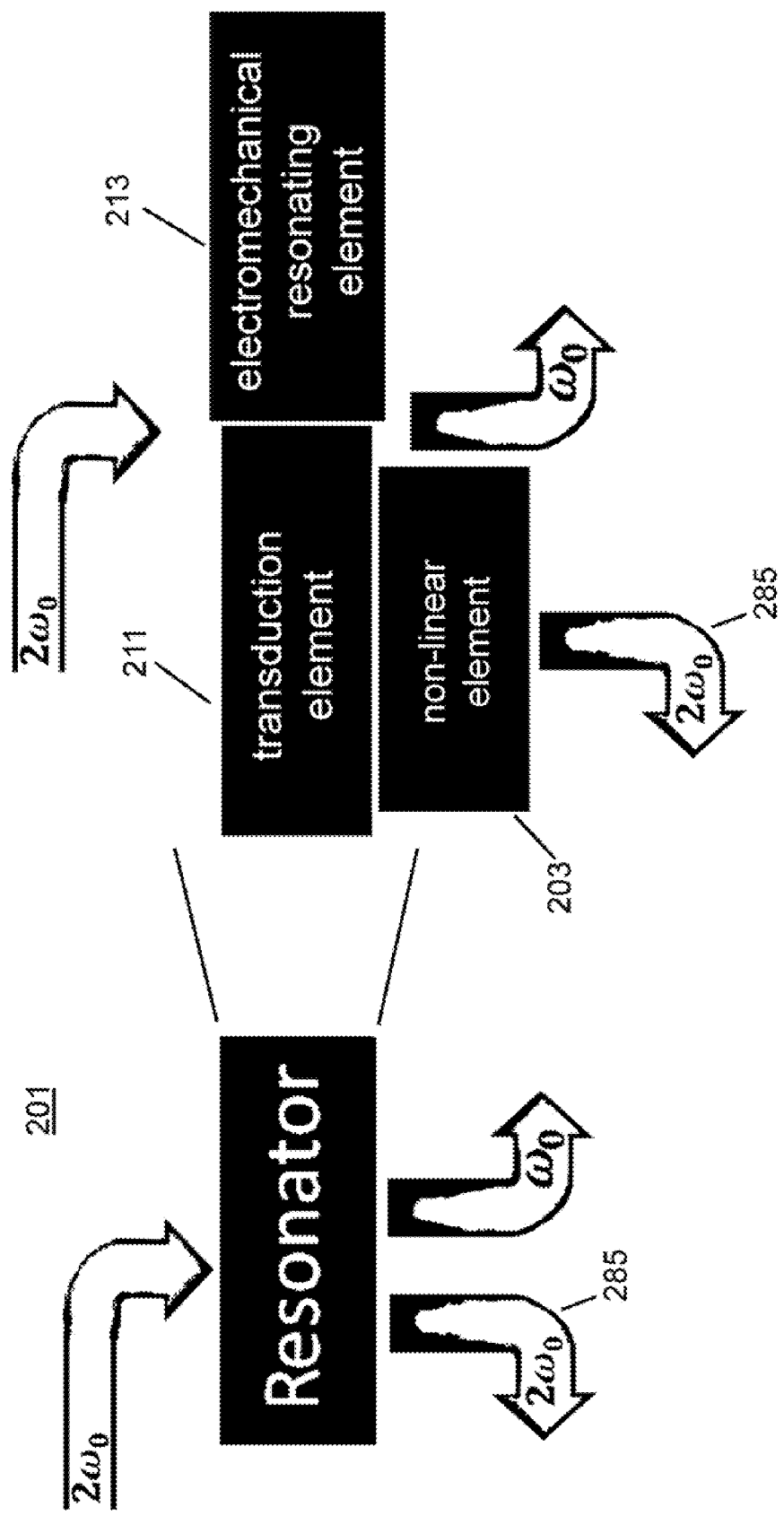
FIG. 4A shows a block diagram of one embodiment of a parametric feedback oscillator where the non-linear element function is accomplished by the transduction element (e.g., a readout transducer) of the resonator.
Figure 4B:
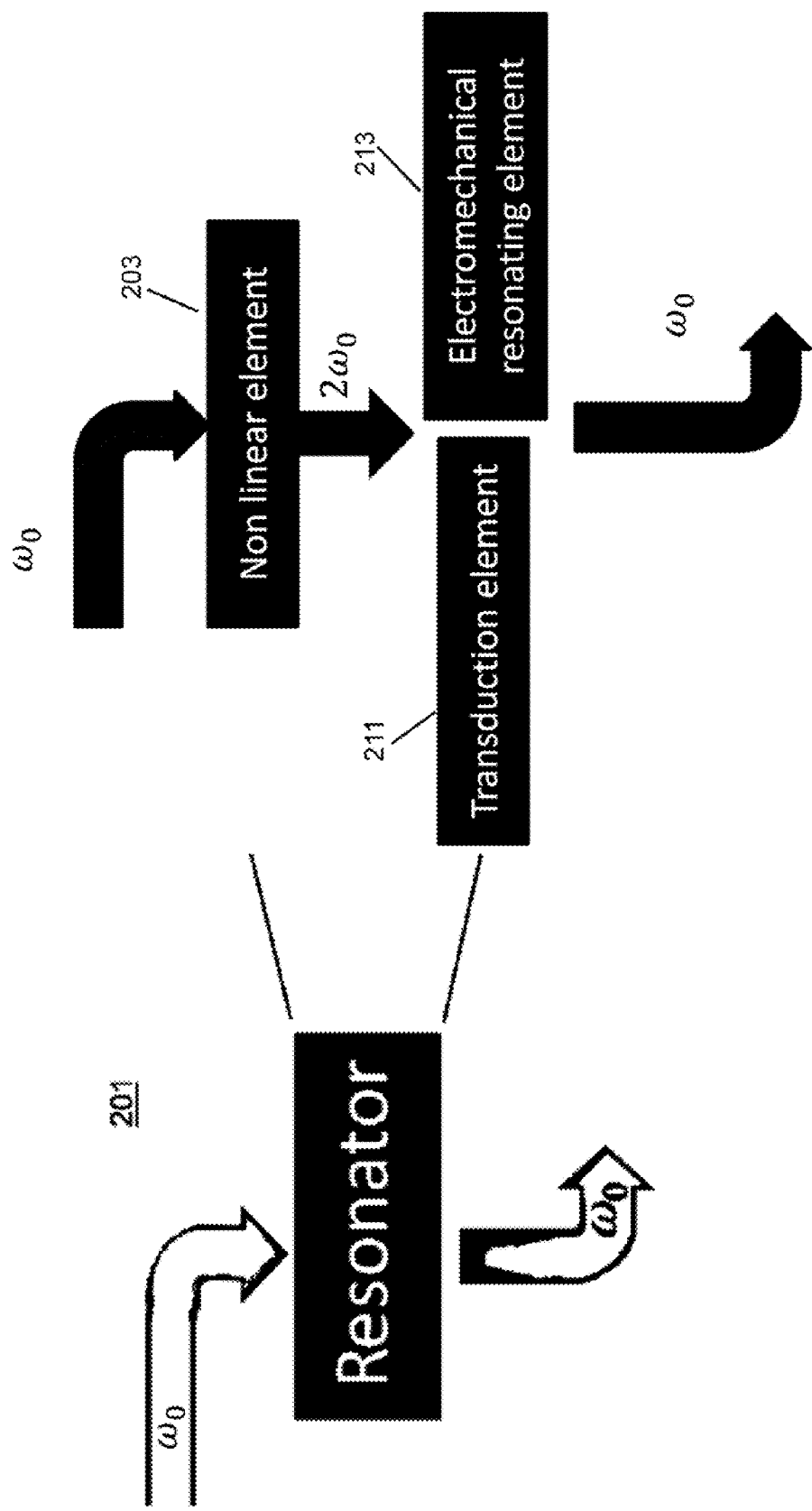
FIG. 4B shows a block diagram of another embodiment of a parametric feedback oscillator where the non-linear element function is accomplished by the transduction element (e.g., an actuator) of the resonator.

FIG. 4A and FIG. 4B show block diagrams of exemplary transduction mechanisms, such as those based on nonlinear effects of the mechanism, which can be used to provide a doubled frequency feedback signal. FIG. 4A shows a block diagram of a resonator having a non-linear element following a transduction element. FIG. 4B shows a block diagram of a resonator having a transduction element following a non-linear element. Both of the embodiments shown in FIG. 4A and FIG. 4B of a parametric feedback oscillator show that the function of the non-linear element can be combined into the resonator structure. For example, in the embodiment of FIG. 4A, a transduction "readout" element in or near the physical resonator structure can accomplish the $\omega_0$ to $2\omega_0$ conversion function. In the embodiment of FIG. 4B, an actuation part of the transduction element can similarly accomplish the $\omega_0$ to $2\omega_0$ conversion function. In both examples, the resonator structure performs the function of the non-linear element function of the cascaded feedback path.

Electrostatic actuation, for example, is a nonlinear technique that can be used to parametrically excite the resonator even though the applied signal is proportional to the motion. It is also possible to have a technique where the transduction of the resonator motion is such that the transduced signal is not linearly proportional to the motion itself, but rather has a quadratic dependence. Capacitive and optical detection, for example, usually display such nonlinear effects. Piezoresistive and piezoelectric detection can also provide a signal proportional to the displacement squared (including a signal at $2\omega_0$), such as when the neutral axis of the structure is in the middle of the active layer. Thus, the feedback loop structure can be simplified by combining the nonlinear element functionality into a suitable transduction mechanism, which is already coupled to the resonator, either in the actuation or detection/conversion aspect of transduction, or both.

For frequencies within a usable or rated bandwidth of an analog device, the analog device can also be used to double the frequency, regardless the transduction mechanism or the operating frequency. The use of an analog device is based on the generation of superior harmonics ($2\omega_0$, $3\omega_0$, $4\omega_0$ . . . ) from the signal $\omega_0$, for example, by use of a saturated element, or any other suitable nonlinear analog element.

Any suitable commercially available frequency doubler, such as a frequency doubler comprised of internal diodes, saturated amplifiers, or devices using gain compression, can also be used as the non-linear element. Subsequent suppression of undesired harmonics ($\omega_0$, $3\omega_0$, $4\omega_0$ . . . ) can be accomplished by means of high order filters or band-pass filters to provide a suitable attenuation and to generate a substantially clean signal at $2\omega_0$.

For suitably small amplitudes, and before reaching the saturation of the second harmonic, taking into consideration the nonlinear nature of $2\omega_0$ signal generation, any of the above described methods can provide a feedback where the magnitude of the drive is proportional to the vibration amplitude squared. This mode of operation is in contrast to prior art oscillator feedback schemes, where the magnitude of the drive is linearly dependent on the vibration amplitude for small amplitudes.

Parameter Excitation

The resonator is driven by the feedback signal at twice the natural frequency of the resonator, which is parametric driving. This parametric driving can be achieved in various ways. One way to provide parametric driving is based on the use of "actuation nonlinearities", such as, for example, by use of capacitive techniques, or "mechanical nonlinearities", such as, for example, by use of mechanical or piezoelectric tuning techniques.

Capacitive tuning of the resonant frequency presents the advantage that it can be implemented regardless of the boundary conditions of the beam geometry (such as clamped-clamped, clamped-free, and free-free, where the terms "clamped" and "free" refer to the condition of an end of a beam). However, capacitive tuning can generate a cross-talk with the (linear) actuation causing undesirable shifts in other non linear parameters.

Figure 19:
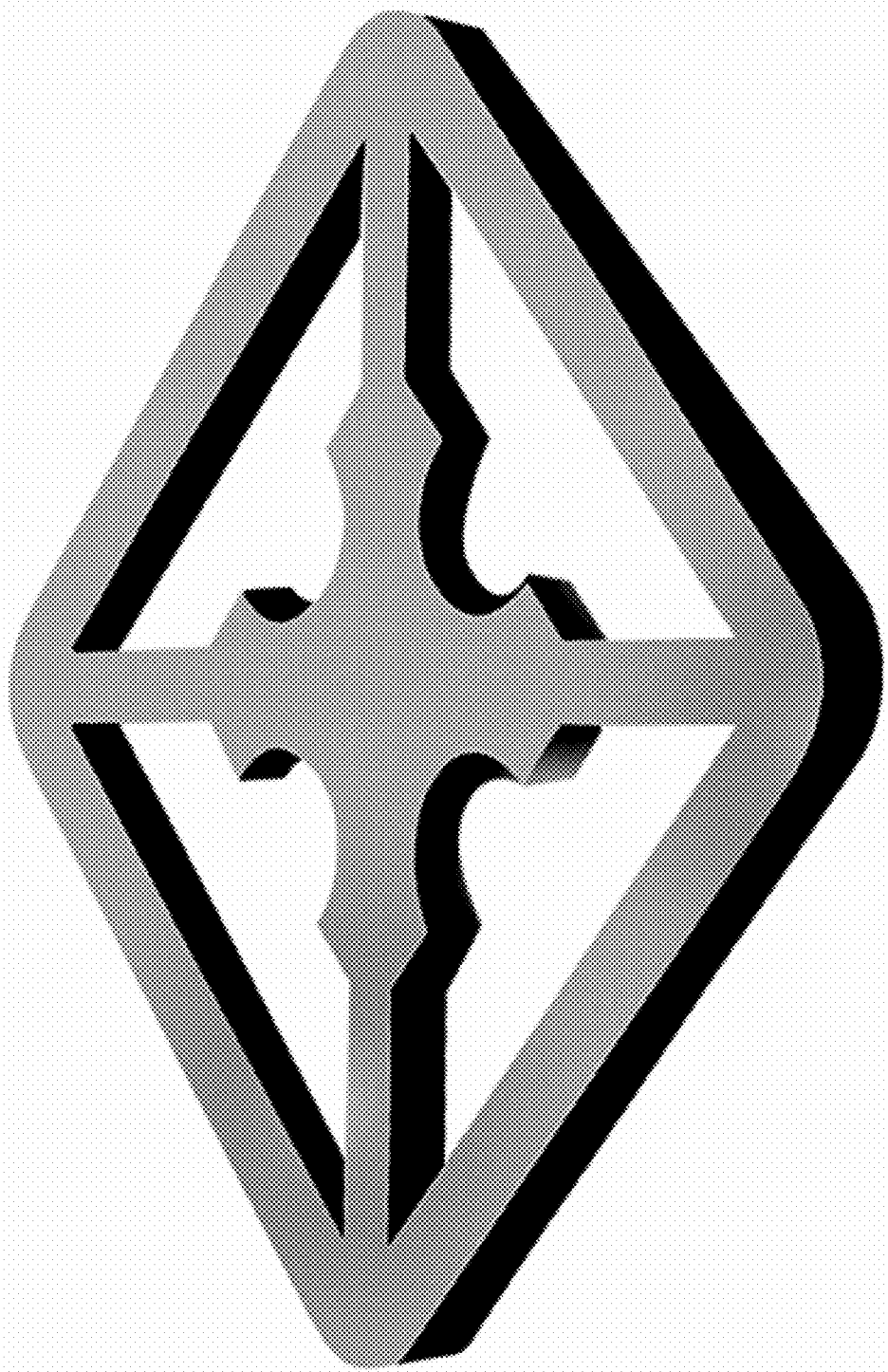
FIG. 19 shows an exemplary resonator geometry believed suitable for use in a NEMS or MEMS parametric feedback oscillator.

Any suitable resonating mode can be used including flexural mode, contour mode, bulk, surface acoustic wave (SAW), or flexure plate wave (FPW). Any suitable geometry can be used including beams, square plates, ring resonators, and other geometries. FIG. 19 shows an exemplary resonator geometry believed suitable for use in a NEMS or MEMS parametric feedback oscillator. For example, the resonator can include a clamped-clamped beam, a clamped-free beam, a free-free beam, a square plate resonator, a disk resonator, a ring resonator, a contour mode resonator, and/or a bulk mode resonator. A resonator can also include a plurality of same or different type beams or any other suitable resonator structure. Typically the beams or other resonator structures include a metal, a semiconductor, an insulator, and/or a piezoelectric. Suitable materials include multi-stacked layers of metal-piezoelectric-metal, aluminum, gold, platinum, silicon, silicon nitride, silicon carbide, silicon oxide, molybdenum, aluminum nitride, gallium arsenide, aluminum gallium arsenide, gallium nitride, carbon, zinc oxide, boron nitride, piezoceramic materials (such as lead zirconate titanate, PZT), lithium niobate, lithium tantalate, sodium niobate, graphene, and carbon nanotubes. A resonator can be set in motion by dynamically modulating at least one of its physical parameters such as frequency, elastic constant, and mass and by using a technique that relies on actuation, mechanical and/or geometric effects. Resonator actuation nonlinearities can be caused by optical tuning and capacitive tuning. Mechanical effects can include internal stress and material properties changes. Such a resonator can be configured to be tuned by a tuning method such as piezoelectric tuning, thermal tuning, and an externally applied axial force. Geometric effects can include changes in the geometry or size of the resonator. Actuation or detection can be accomplished by non-linear capacitive actuation or by a non-linear 2-omega ($2\omega$) piezoresistive detection.

Mechanical tuning of the resonant frequency can be performed by exerting a longitudinal force in a clamped-clamped beam, thus generating either a tension or a compression that alters the effective stiffness of the beam. The relative change in resonant frequency is given by the following equation:

$$\frac{\Delta\omega}{\omega_0} = \beta \frac{L^2}{EI} F_L \qquad \text{Eq. 1}$$

where $\beta$ is a parameter that depends on the shape of the vibrational mode, $F_L$ is the longitudinal force applied to the beam (either tension or compression), L is the length and EI is the flexural rigidity of the beam. This scheme is generally not suitable for clamped-free or free-free geometries and the scalability with the frequency is compromised because the larger the frequency of the mechanical structure the harder it is to tune (which implies a stiffer structure).

Figure 5:
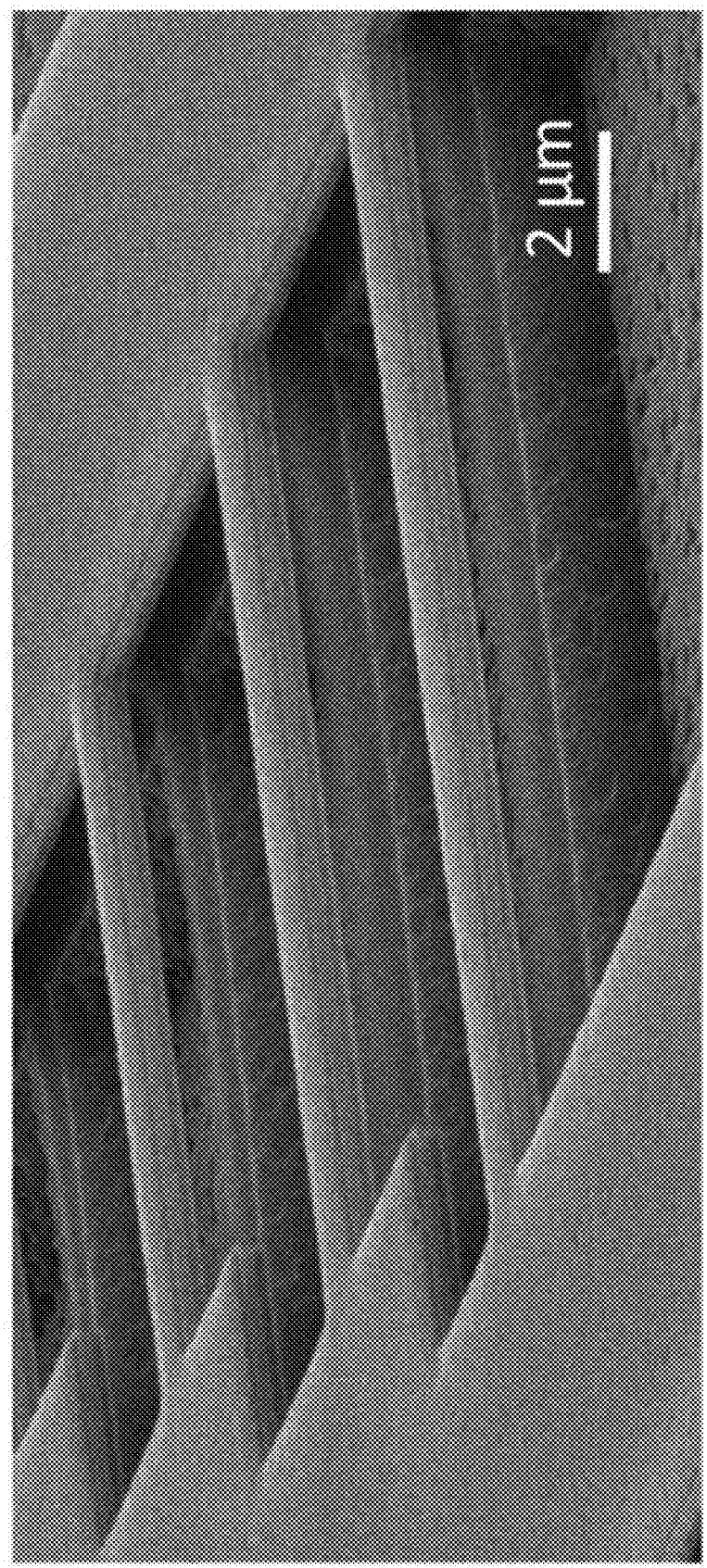
FIG. 5 shows an electron micrograph of a piezoelectric material layer between two electrode layers.

Piezoelectric tuning is another scheme well suited for parametric excitation of clamped-clamped beams. FIG. 5 shows a electron micrograph of an exemplary piezoelectric material and two electrodes. By suspending such a multilayer structure (in which more layers can be used for improved performance), it is possible to obtain a frequency tunability by the application of an external voltage between the electrodes. Then the relative change in frequency is given by a modification of Eq. 1:

$$\frac{\Delta\omega}{\omega_0} = \beta \frac{wL^2}{EI} E_{\pi e} d_{31} V \qquad \text{Eq. 2}$$

where W is the width of the beam, $E_{\pi e}$ is the Young's modulus of the piezoelectric material, $d_{31}$ is the piezoelectric coefficient and V is the applied voltage between the two metal layers. If the stack of layers is substantially symmetric, no bending moment is caused, and the parametric actuation is uncoupled from the direct driving. Thus, a substantially symmetric stack of layers can be used to remove effects that undesired harmonics can have on the motion of the resonator.

Figure 6:
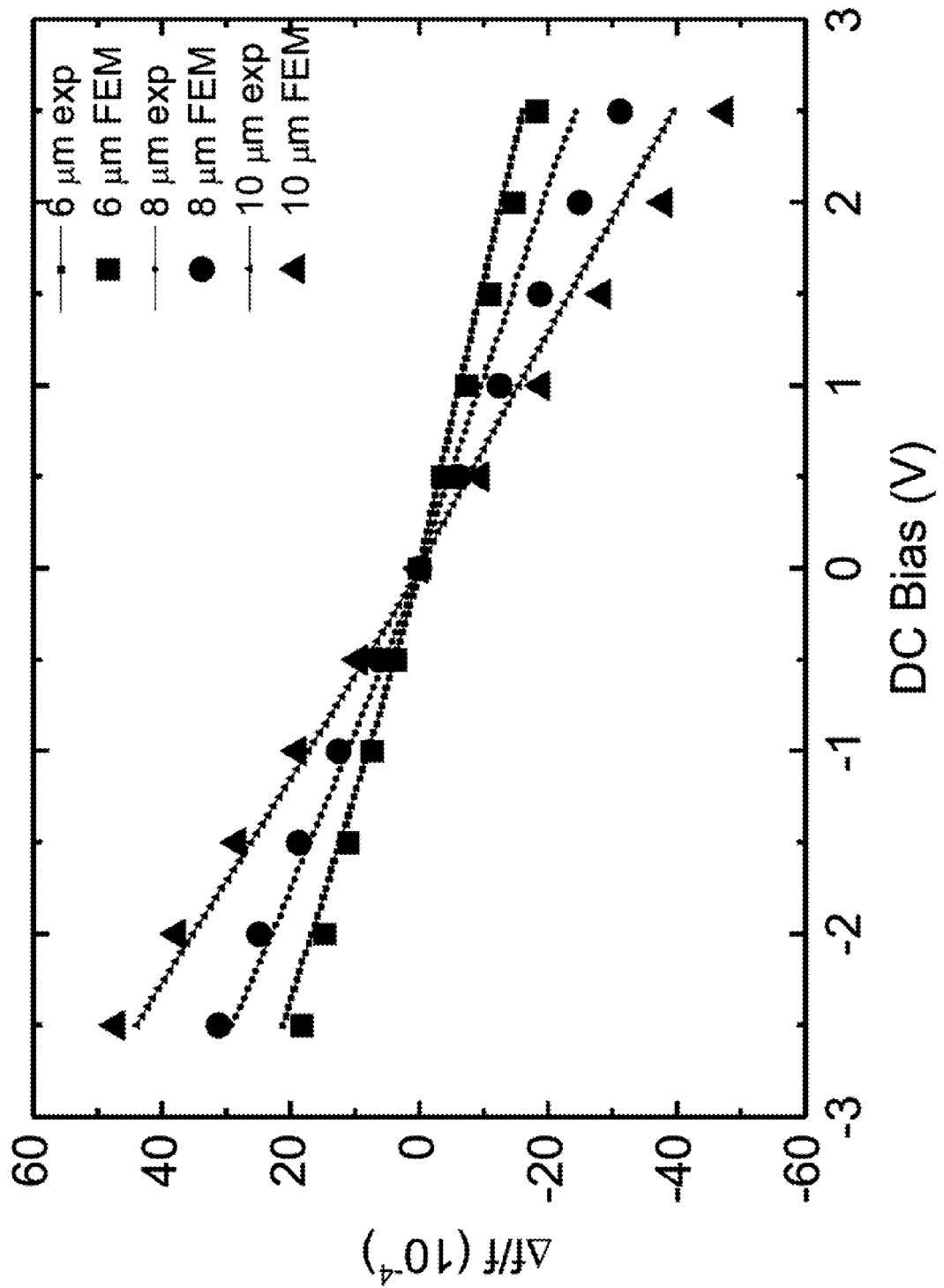
FIG. 6 shows a graph of experimentally measured tuning of the piezoelectric clamped-clamped beams shown in the electron micrograph of FIG. 5.

FIG. 6 shows a graph of experimentally measured tuning of the piezoelectric clamped-clamped beams shown in the electron micrograph of FIG. 5. The curves represent experimental data taken by applying a DC bias between the top and the bottom electrodes. The individual points were obtained using finite element modeling analysis.

Signal Transduction

A variety of transduction mechanisms can be used in order to build a parametric feedback oscillator. As described hereinabove, some methods can be more advantageous than others, due to intrinsic nonlinearities which allow for the generation of higher harmonics. However, since it is possible to generate those harmonics via external analog devices, any transduction method that provides a sufficient signal level can be used. Suitable transduction schemes include, but are not limited to, those based on magnetomotive, capacitive, optical, piezoresistive and piezoelectric techniques.

Fabrication

Device fabrication can be accomplished using any suitable micro- or nano-fabrication process. Any suitable micro-fabrication or nano-fabrication process steps appropriate to the materials and geometry of one or more devices can be used. In particular, in some preferred embodiments, processes that are compatible with CMOS fabrication technology are contemplated.

A parametric feedback oscillator represents a novel way of building stable and self-sustained resonant systems offering a variety of advantageous characteristics from high tunability to reduction of noise, as described hereinbelow.

High Tunability

As described in more detail in the theoretical description hereinbelow, and specifically with regard to the graphs of FIG. 8A and FIG. 8B, it can be seen that the oscillation frequency can be tuned by changing a control parameter $\Delta$ within a range. Some of our experiments have indicated that the range of tunability can be at least 12% of the central frequency. FIG. 9 shows one exemplary graph illustrating the measured oscillation frequency of a parametric feedback oscillator as a function of a control parameter configured to change the phase shift in the feedback path. We were able to achieve a tuning range of up to 12% of the resonant frequency by changing the phase shift. Such a relatively wide range tuning ability can be particularly advantageous when synchronizing two or more coupled oscillators.

Multiple Feedback Systems

So far, we have only discussed oscillators with a single feedback loop, either in $\omega$ (prior art oscillator) or in $2\omega$ (parametric feedback oscillator). It is also possible to implement systems having multiple feedback loops. As described in the theoretical section hereinbelow, the constitutive equation assumes the form:

$$\frac{dA}{dT} + \frac{1}{2}A - \frac{3i-\eta}{8}|A|^2 A = \sum_n F_n(|A|)e^{i\Delta_n}\frac{A}{|A|} \qquad \text{Eq. 3}$$

where the sum extends over all the feedback loops, each of which has an independent phase shift ($\Delta_n$) and gain function ($F_n$). For example one can implement two feedback loops, the first one in $\omega$ $$F_1(|A|) = \frac{\Gamma_1|A|}{1 + \frac{\Gamma_1}{S_1}|A|} \qquad \text{Eq. 4}$$

and the second one in $2\omega$ $$F_2(|A|) = \frac{\Gamma_2|A|^3}{1 + \frac{\Gamma_2}{S_2}|A|^2} \qquad \text{Eq. 5}$$

where $\Gamma$ is the gain for small amplitudes and S is the saturation for large amplitudes. This double feedback scheme can be designed so that the first loop makes the trivial solution (A=0) unstable and therefore an oscillator with parametric feedback operates without the need of an external AC source of energy.

Tuning of Nonlinearities

The amplitude equation describing the dynamics of a Parametric Feedback Oscillators is given by:

$$\frac{dA}{dT} + \frac{1}{2}A - \frac{1}{8}\left(3i - \eta + \frac{\Gamma}{1 + \frac{\Gamma}{S}|A|^3} \cdot e^{i\Delta}\right)|A|^2 A = 0 \qquad \text{Eq. 6}$$

This implies that, depending on the value $\Delta$, the parametric feedback term effectively changes the nonlinear stiffness term (the imaginary term within brackets), the nonlinear damping term (the real term within brackets) or both simultaneously. If more than one feedback loop is introduced into the system, it is possible to tune both parameters simultaneously in order to optimize the operation of the oscillator. For example, it is possible to adjust the system in order to have the oscillator working at a point in which $$\frac{\partial \omega}{\partial a} = 0$$

and at the same time to maximize the energy of the oscillation. By so extending the dynamic range of the oscillating system, the oscillator phase noise can be substantially reduced. When used in combination with two or more feedback loops and the tuning of nonlinearities, it is believed that oscillator phase noise can be still further reduced.

Applications

Voltage Controlled Oscillator (VCO)

Low-noise and highly stable frequency sources that can be tuned over wide spectral range are typically used in radio frequency (RF) based communications. A parametric feedback oscillator is characterized by a high quality factor in open loop. This high quality factor translates to low oscillator phase noise. Therefore, a parametric feedback oscillator according to the invention can be particularly well suited for use in such RF applications. In addition, a parametric feedback oscillator presents great tunability (up to at least 12% of the resonant frequency). These characteristics also make parametric feedback oscillators ideal candidates for fabricating voltage controlled oscillators (VCOs).

Frequency Sources/Clocks

Highly stable frequency sources are used in many modern electronic devices. In parametric feedback oscillators having multiple feedback loops (both parametric and linear feedback loops), the phase noise is reduced. Reduced phase noise means improved stability of the frequency sources. Thus parametric feedback oscillators according to the invention are particularly well suited for use in frequency source and clock applications.

High Dynamic Range Sensors

Many sensor systems are presently performance limited by their dynamic range. As soon as the sensor starts showing a nonlinear dependence at the input, the signal to noise ratio (SNR) drops and the nonlinear behavior becomes poorly characterized. A parametric feedback oscillator can be used to directly tune and to substantially cancel the nonlinearities of a mechanical system. Thus, a parametric feedback oscillator as described herein can be used to increase the dynamic range and optimal SNR of such sensors.

Exemplary Implementation of a Parametric Feedback Oscillator

Figure 10A:
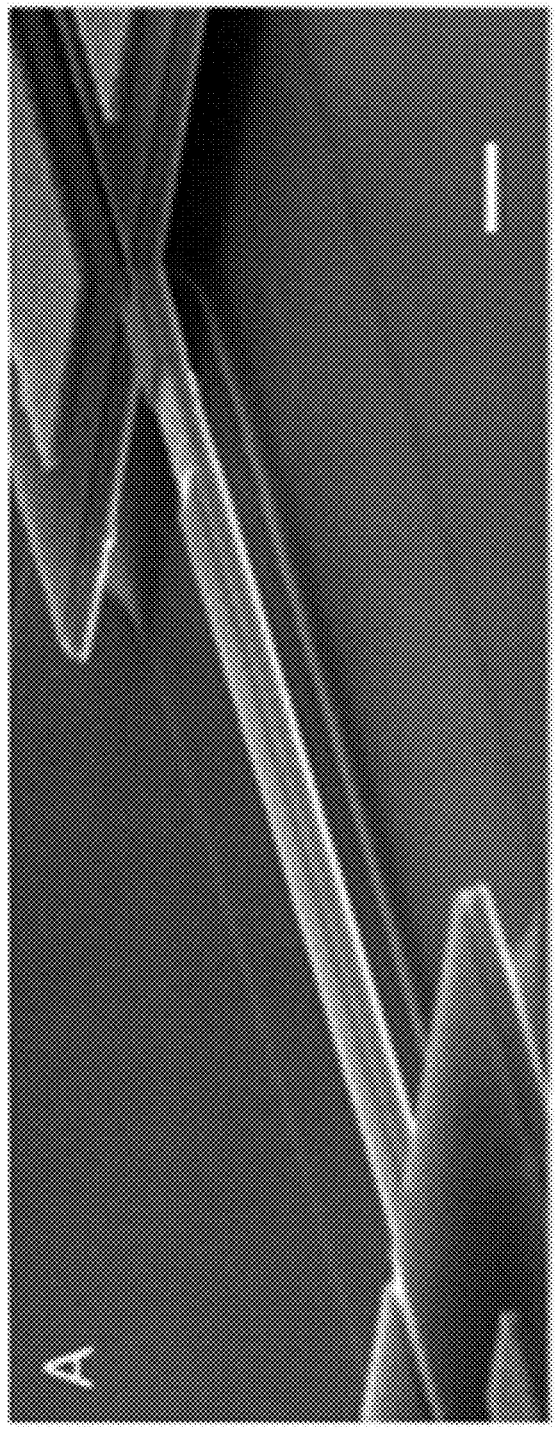
FIG. 10A shows a scanning electron micrograph (SEM) of one exemplary parametric feedback oscillator architecture.

FIG. 10A, in which the scale bar represents 500 nm, shows a scanning electron micrograph (SEM) of one exemplary parametric feedback oscillator architecture. The SEM shows a suspended mechanical device used to demonstrate the parametric feedback oscillator. A metal electrode, which is used for actuation, covers most of the beam's length. The loop on the opposite side of the beam is used for detection. The resonator is based on a nanoelectromechanical system (NEMS) doubly-clamped beam formed by a four-layered stack of aluminum nitride (AlN)-molybdenum (Mo)-AlN-Mo, having a total thickness of 210 nm, a width of 470 nm and a length of 9 μm. Suitable fabrication processes are described in more detail hereinbelow. This system exhibits an analytically predictable nonlinear behavior, and is suitable for parametric excitation by means of piezoelectric frequency tuning. In addition, because of the small size and CMOS or BiCMOS compatible fabrication, it is believed that integration with other electronic circuitry is practical.

Figure 10B:
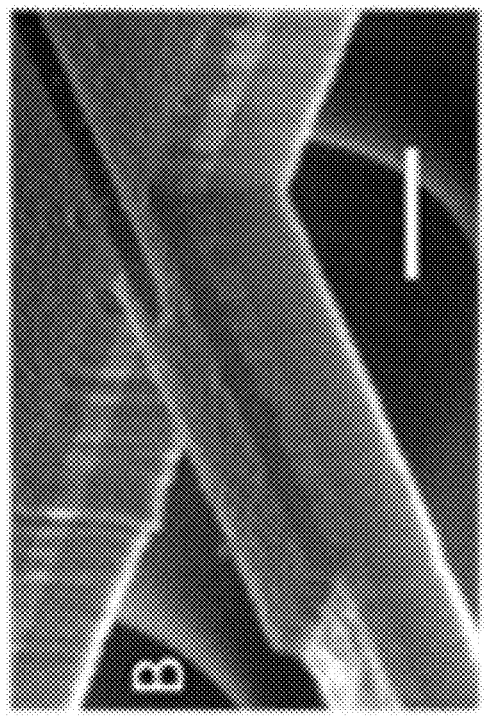
FIG. 10B shows a more detailed view of the piezometallic loop used as a transducer for the motion of the resonator.

FIG. 10B shows a more detailed view of the piezometallic loop used to transduce the motion of the resonator, in which the scale bar represents 500 nm Out-of-plane motion of the beam is detected via strain-induced resistance changes in a piezometallic loop patterned at the end of the beam. In the embodiment shown, actuation is provided by applying voltage to an electrode which covers most of the beam length. The applied voltage is converted into strain by means of the inverse piezoelectric effect. This strain can be used to actuate the beam either directly, or parametrically.

Figure 10D:
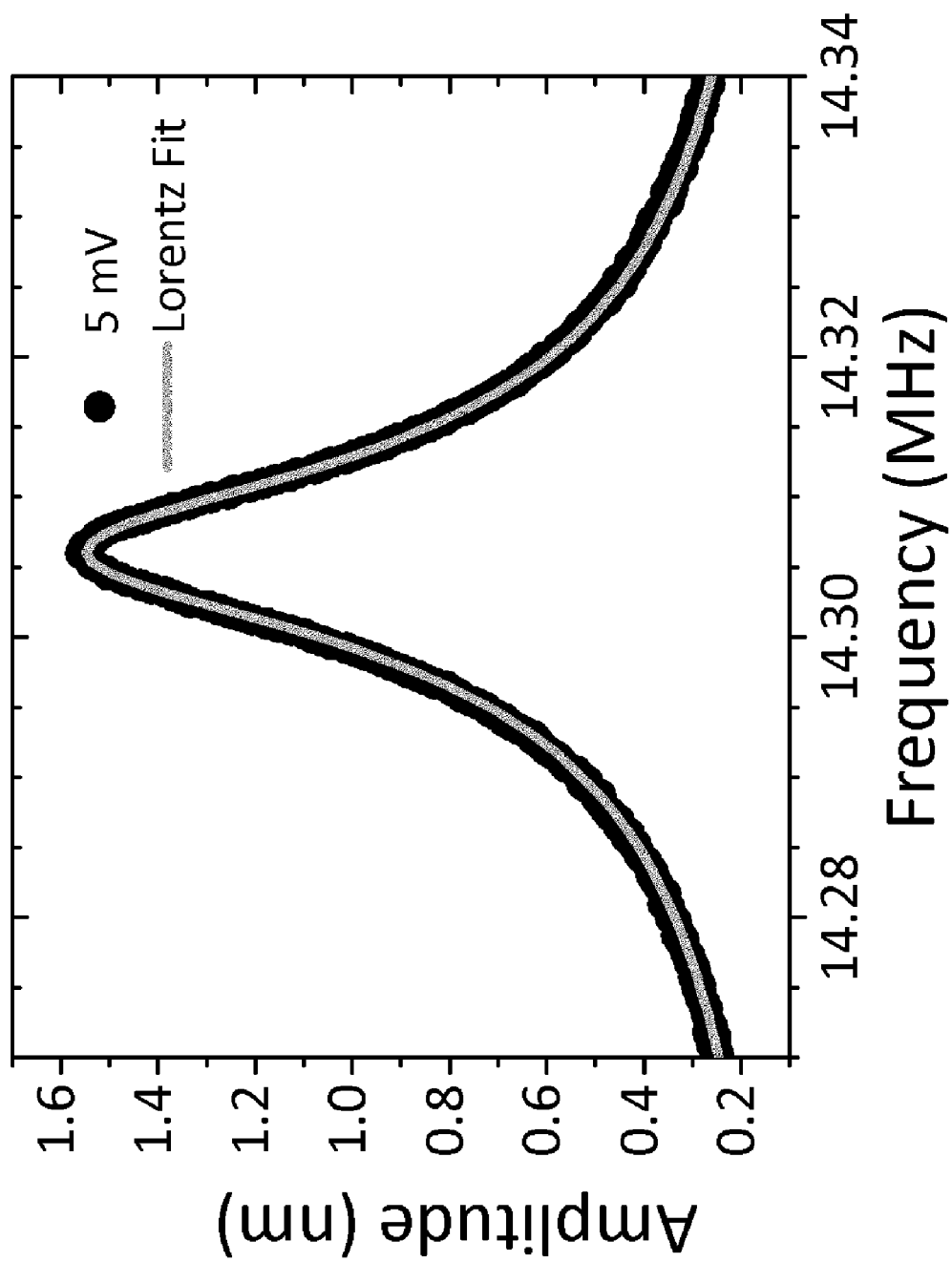
FIG. 10D shows a graph of the resonant response of the resonator around its characteristic frequency.

FIG. 10C shows a graph of voltage spectral density which illustrates the background (system) noise and the thermomechanical peak of the resonator. Detection efficiency (responsivity) of the system is estimated to be 8.7 nm/mV and sensitivity is 0.52 pm/Hz$^{1/2}$. FIG. 10D shows a graph of the linear resonant response of the resonator around its characteristic frequency. By fitting the driven resonant response to a Lorentz peak, we also determined the resonator natural frequency ($f_0$=14.305 MHz) and quality factor (Q=1220).

Figure 10E:
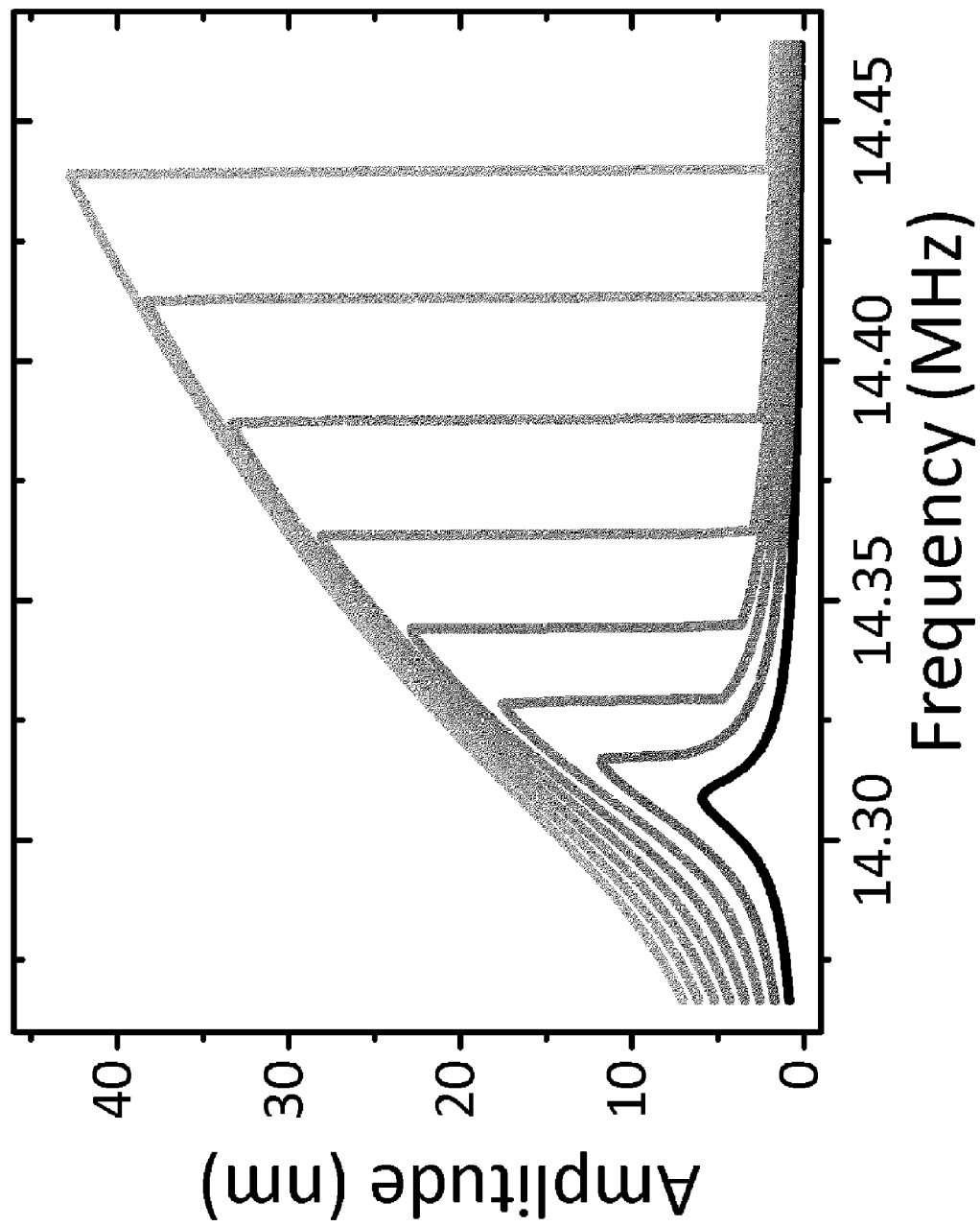
FIG. 10E shows a graph of the response of the resonator to various direct drive signals. The curves show the amplitude response of the resonator around its natural frequency for different driving forces (from 20 mV to 160 mV in steps of 20 mV).

FIG. 10E shows a graph of a direct drive of the resonator. The curves show the amplitude response of the resonator around its natural frequency for different driving amplitudes (from 20 mV to 160 mV in steps of 20 mV). A characteristic stiffening effect can be seen and fitted to a Duffing model, to obtain a value for a critical amplitude of about 9.6 nm and a nonlinear dissipation coefficient of 0.015.

Figure 10F:
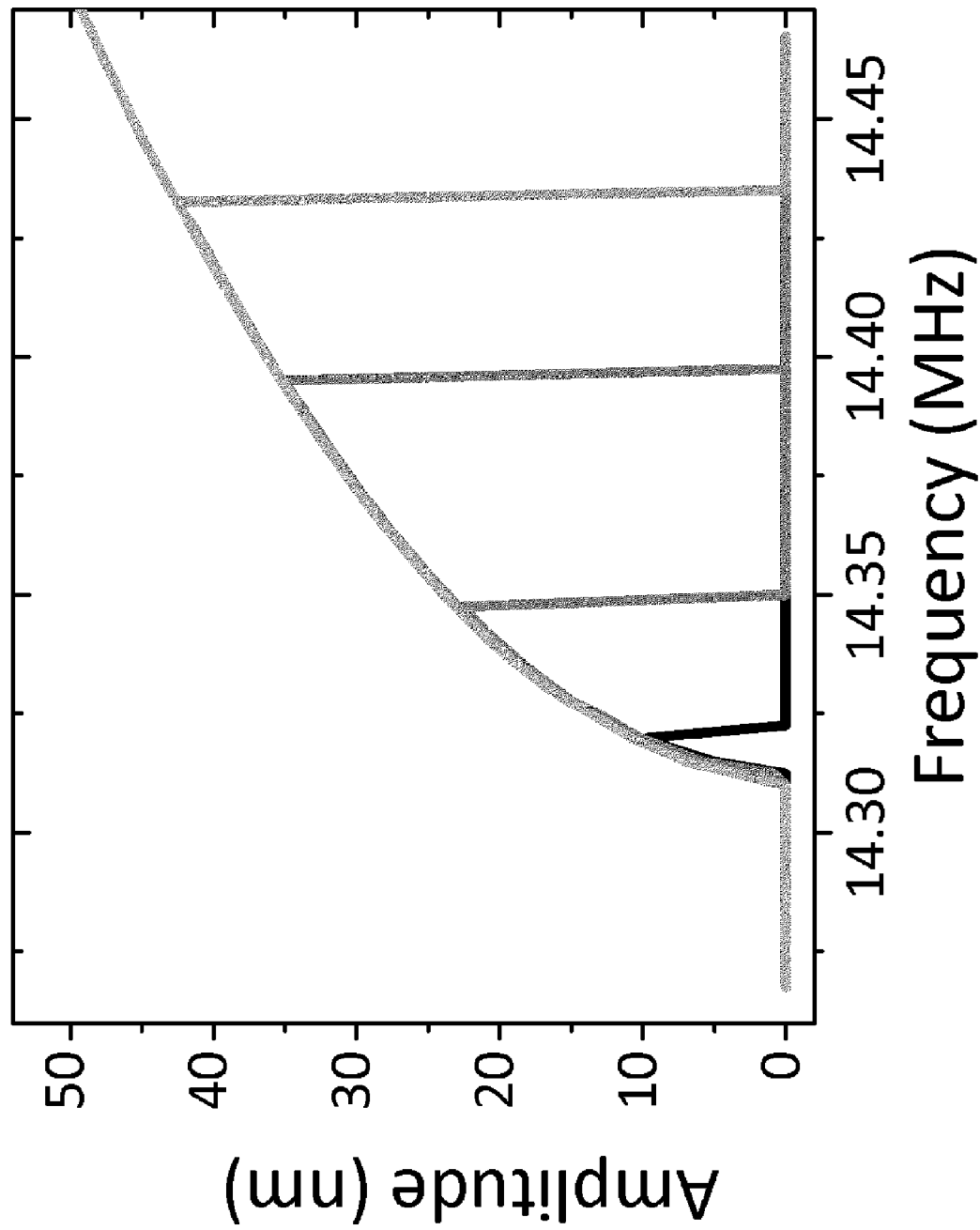
FIG. 10F shows a parametric excitation of the resonator. The curves show the amplitude response of the resonator as a function of half of the driving frequency for different driving amplitudes (from 120 mV to 133 mV in 3 mV steps).

FIG. 10F shows a parametric excitation of the resonator. The curves show the amplitude response of the resonator as a function of half of the driving frequency for different driving amplitudes (120 mV, 123 mV, 126 mV, 130 mV and 133 mV). We use the estimated transduction responsivity to verify that our device presents a stiffening behavior with a critical amplitude of 9.6 nm, as predicted by analytical calculations.

Figure 10G:
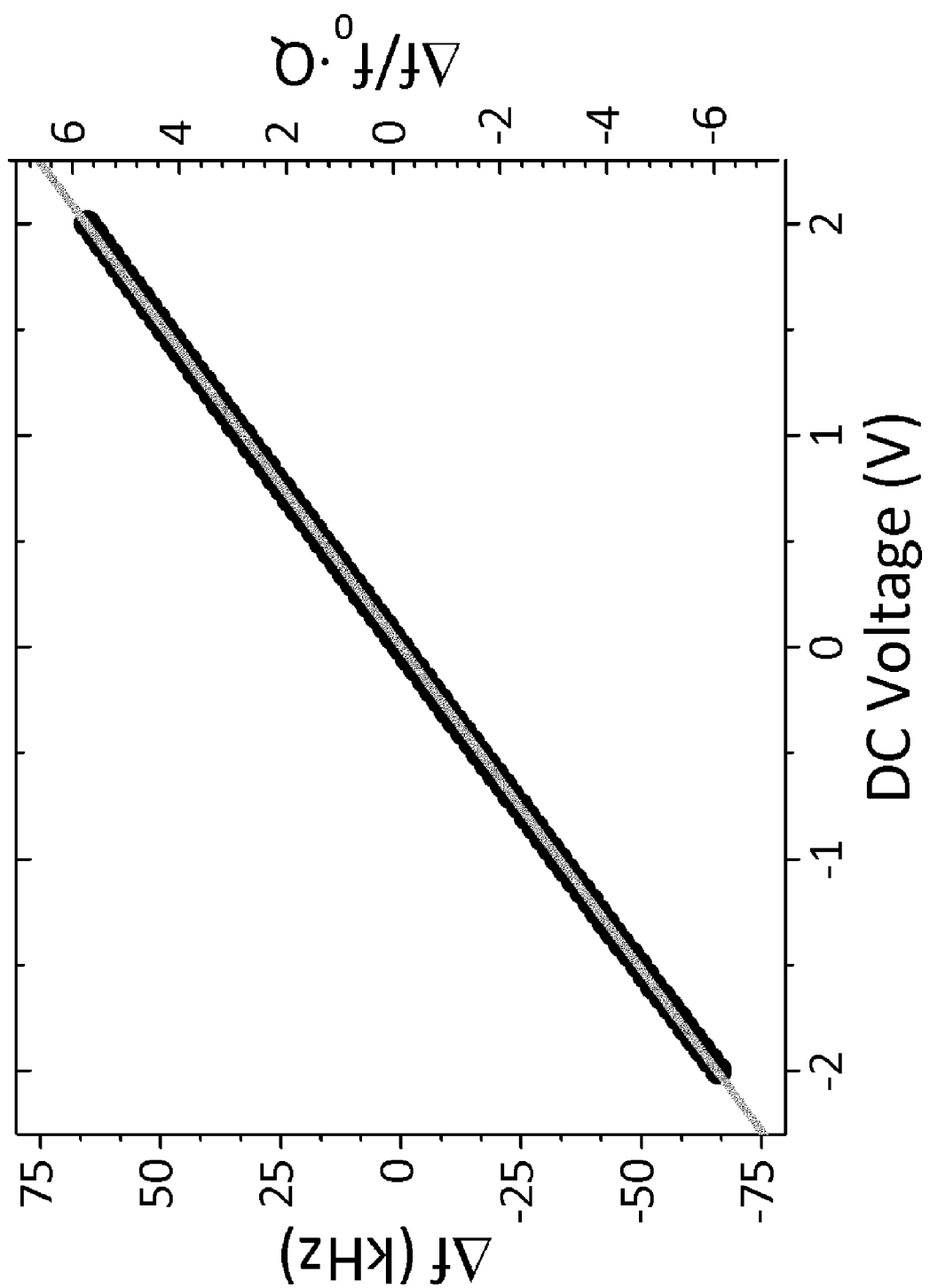
FIG. 10G is a graph of the tunability of the characteristic frequency of the resonator versus DC voltage.

FIG. 10G is a graph illustrating the tunability of the characteristic frequency of the resonator versus DC voltage. We characterized the shift $f_0$ induced by the application of a DC voltage to the actuation electrode. We found it to be 35 kHz/V, thus allowing for parametric excitation which we subsequently measured by monitoring the amplitude of vibration at half of the driving frequency. Consistent with the expected parametric threshold and the absence of crosstalk, when the applied voltage was smaller than 115 mV, no signal in the vicinity $f_0$ was detected. In the graph of FIG. 10F, we show that when actuated parametrically, both amplitude and frequency detuning grow much faster with drive, rather than when actuated directly (FIG. 10E). Even though for 120 mV drive, both amplitude and detuning are higher for direct drive, for drives above 130 mV the situation was found to be reversed. Thus, accessible amplitudes for the same driving voltage can be much higher in the parametric case.

Figure 11A:
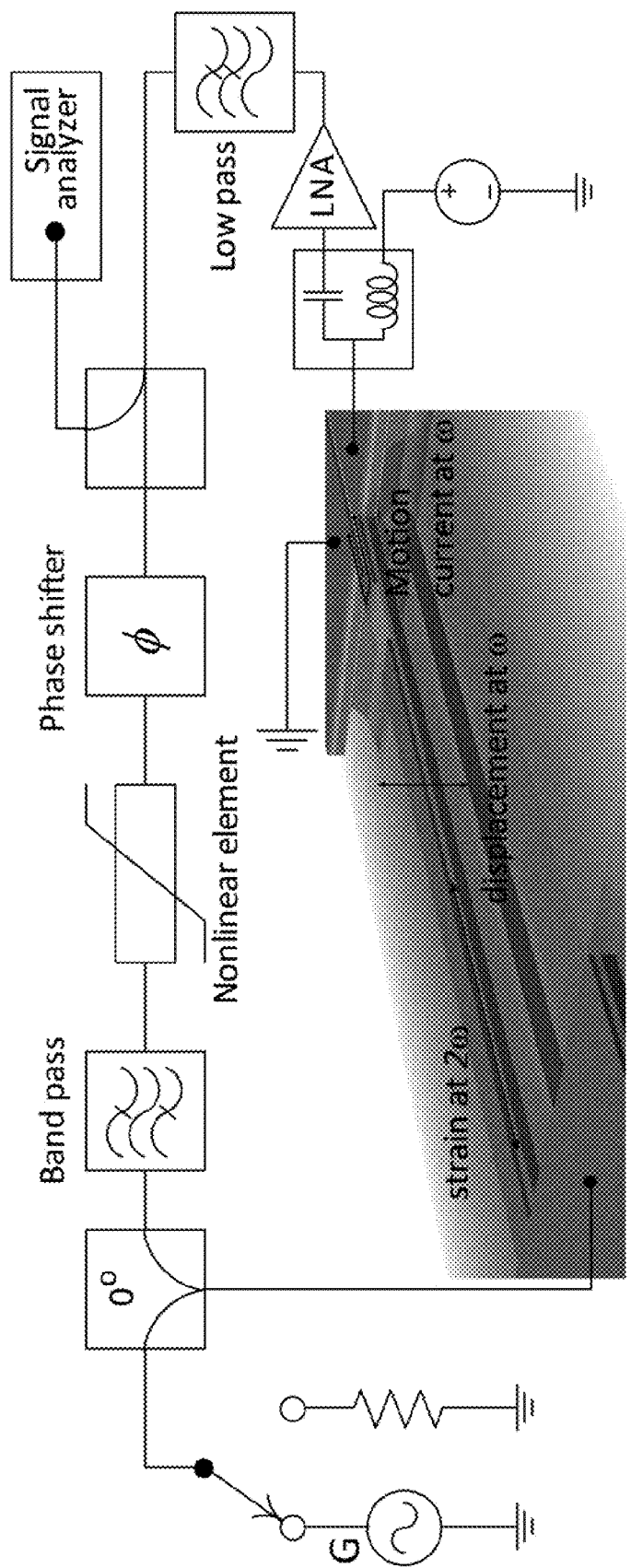
FIG. 11A shows a block diagram of the implemented parametric feedback oscillator with the resonator illustrated by the SEM of FIG. 10A and FIG. 10B.

FIG. 11A shows a block diagram of the implemented parametric feedback oscillator with the resonator illustrated by the SEM of FIG. 10A and FIG. 10B. The signal from the resonator is amplified and filtered at high frequencies to eliminate higher harmonics and noise. After an externally controlled phase delay φ is applied, the signal is passed through a nonlinear element followed by a bandpass filter to ultimately generate a signal at double frequency 2ω. This signal is applied to the actuation port of the beam through a power combiner that allows simultaneous feedback and a direct drive with an external source (G), which is used to initiate the oscillations. Once the self-sustaining state has been reached, the source can be disconnected and the motion persists.

With a substantially constant DC bias voltage applied across the piezoresistor, the out-of-plane mechanical motion is transduced. The motion signal can then be amplified and filtered to suppress high frequency noise and the higher harmonics. After the signal is delayed by φ by a voltage controlled phase shifter, the signal is passed through a nonlinear element which is followed by a bandpass filter. The bandpass filter is optimized to generate a signal at 2ω with an amplitude proportional to the square of the resonator motion. Such a highly selective bandpass filter ensures a substantially complete cancellation of the fundamental frequency ω and higher (3ω, 4ω, etc.) harmonics so that the signal fed back into the resonator is substantially a pure sinusoidal waveform at a frequency of 2ω. Such a signal generates negligible off resonance motion via direct-drive actuation. Instead, it modulates the characteristic frequency of the beam. Modulating the characteristic frequency of the beam with a drive level that is higher than the parametric threshold, causes the oscillation motion to commence. In comparison with oscillators of the prior art, zero-amplitude is a stable solution for a parametric feedback oscillator. Therefore, it is necessary to initiate the motion by an external source. However, after the inception of oscillation, the starting drive can be turned off and the motion will persist. In addition, and also in contrast with oscillators of the prior art, because the mechanical resonator acts as a frequency divider the frequencies of the feedback and output signals are spaced far apart from one another, such that undesired crosstalk between the driving and the motional signal is substantially eliminated. The equation of motion of the described system can be written as:

$$\ddot{x} + \frac{\omega_0}{Q}\dot{x} + \omega_0^2(1 + \zeta(t, \phi))x + \alpha x^3 + \eta x^2 \dot{x} = G(t) \qquad \text{Eq. 7}$$

where x represents the displacement of the resonator; α is the nonlinear spring constant, or Duffing parameter; η is the coefficient of nonlinear damping; G(t) is an external driving signal (G=0 when the system is in self-sustained oscillation);

and $\zeta(t, \phi)$ is the feedback function, which depends on the resonator displacement and the externally controlled phase delay.

Eq. 7 indicates that by varying two external parameters, $\phi$ and feedback gain, it is possible to control the effective nonlinear stiffness coefficient (proportional to $x^3$) and the viscous nonlinear damping (proportional to $x^2 \dot{x}$). We demonstrated experimentally such a capability of controlling nonlinear system parameters. The demonstration was done by measuring the driven resonant response with the parametric feedback level set below the oscillation threshold for different values of $\phi$.

Figures 11B, 11C, 11D:
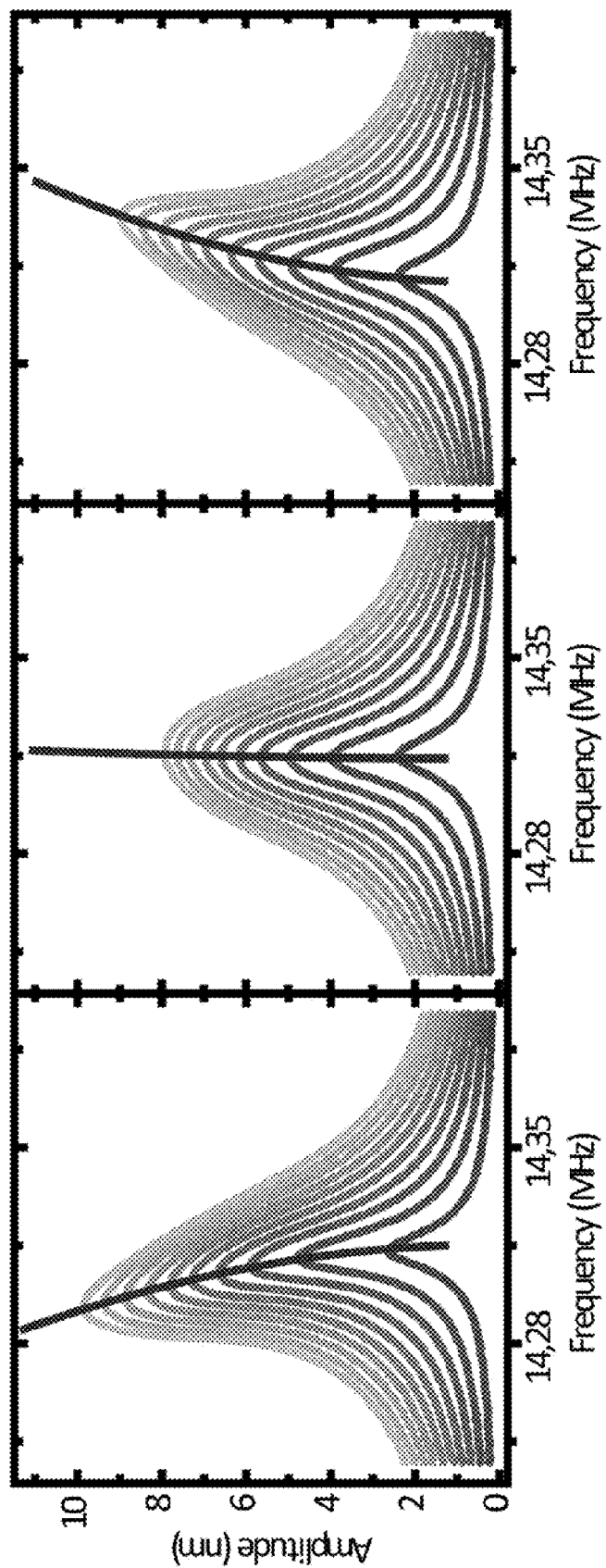
FIG. 11B shows a graph of amplitude plotted versus frequency illustrating resonator's negative nonlinear stiffness coefficient.
FIG. 11C shows a graph of amplitude plotted versus frequency illustrating a negligible resonator's nonlinear stiffness coefficient and an enhanced nonlinear damping coefficient.
FIG. 11D shows a graph of amplitude plotted versus frequency illustrating resonator's positive nonlinear stiffness coefficient.

The corresponding drive amplitude sweeps are shown in FIG. 11B, FIG. 11C, and FIG. 11D, where the resonator's nonlinear coefficient changes from negative (shown in FIG. 11B), to positive (FIG. 11D). At an intermediate phase (shown in FIG. 11C), the effective nonlinear stiffness constant vanishes and a larger effective nonlinear damping is apparent from the increased peak widths at higher drive levels. Such a relatively high level of control of the nonlinear properties of the system by means of parametric feedback is especially promising for operation in combination with a 1-$\omega$ direct-drive feedback. The parametric feedback can then be used to increase the system's dynamic range resulting in a reduction of oscillator phase noise.

The motion in the system with a single parametric feedback loop commences when oscillation criteria are met. The oscillation can be characterized in part by capturing its power spectrum and comparing it to the open loop mechanical resonator frequency response.

Figure 12A:
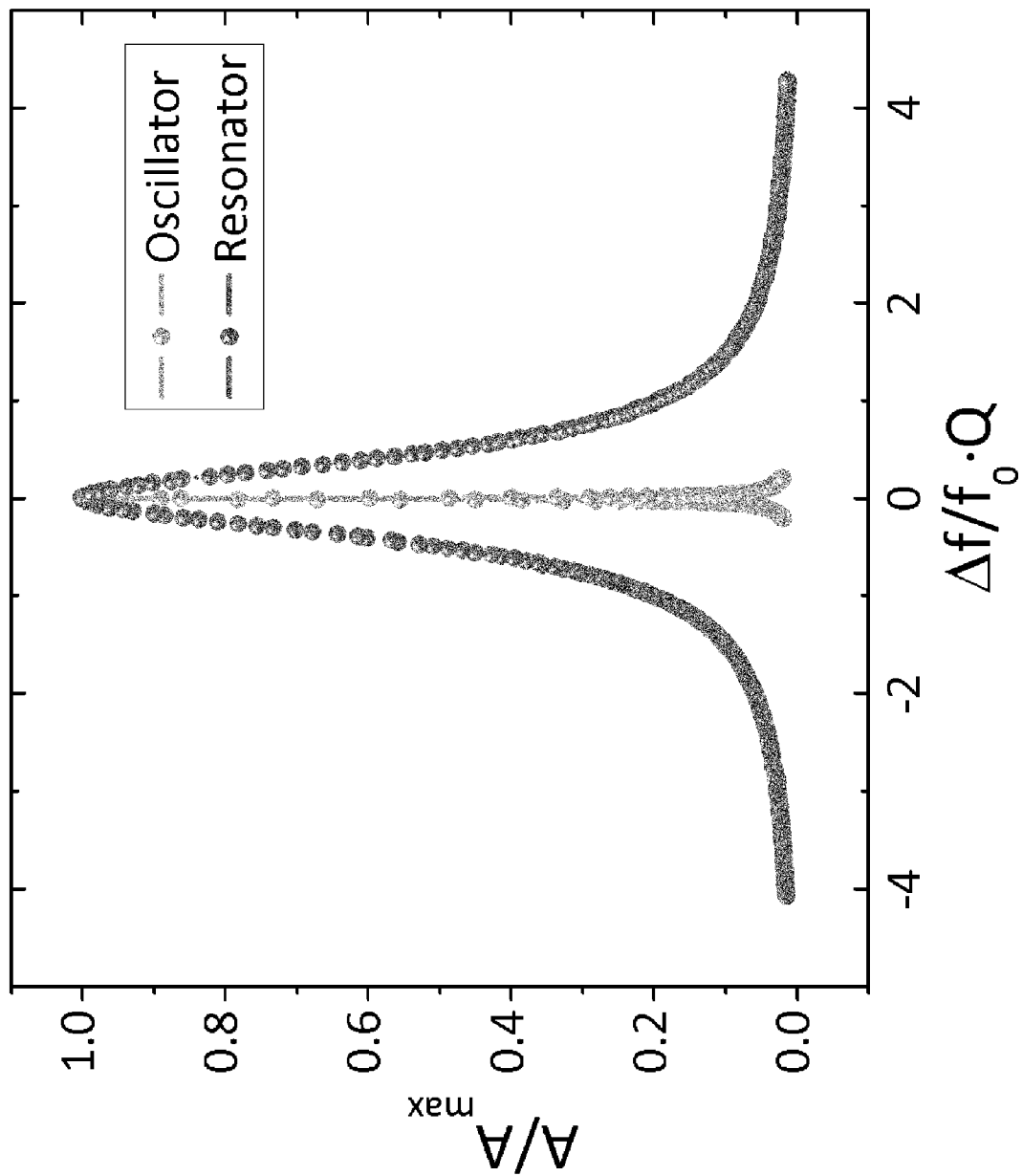
FIG. 12A shows a graph of a power spectrum of a Parametric Feedback Oscillator (PFO) as compared with the frequency response of the open loop (without=feedback) resonator.

FIG. 12A shows a graph of a power spectrum of a parametric feedback oscillator. We extracted an effective quality factor of the oscillator spectrum of 99000. The graph shows a normalized comparison between the spectral power of a PFO (center curve) and the linear resonant response of the open-loop system (outer curve). The compression ratio was estimated to be 82.

Figure 12B:
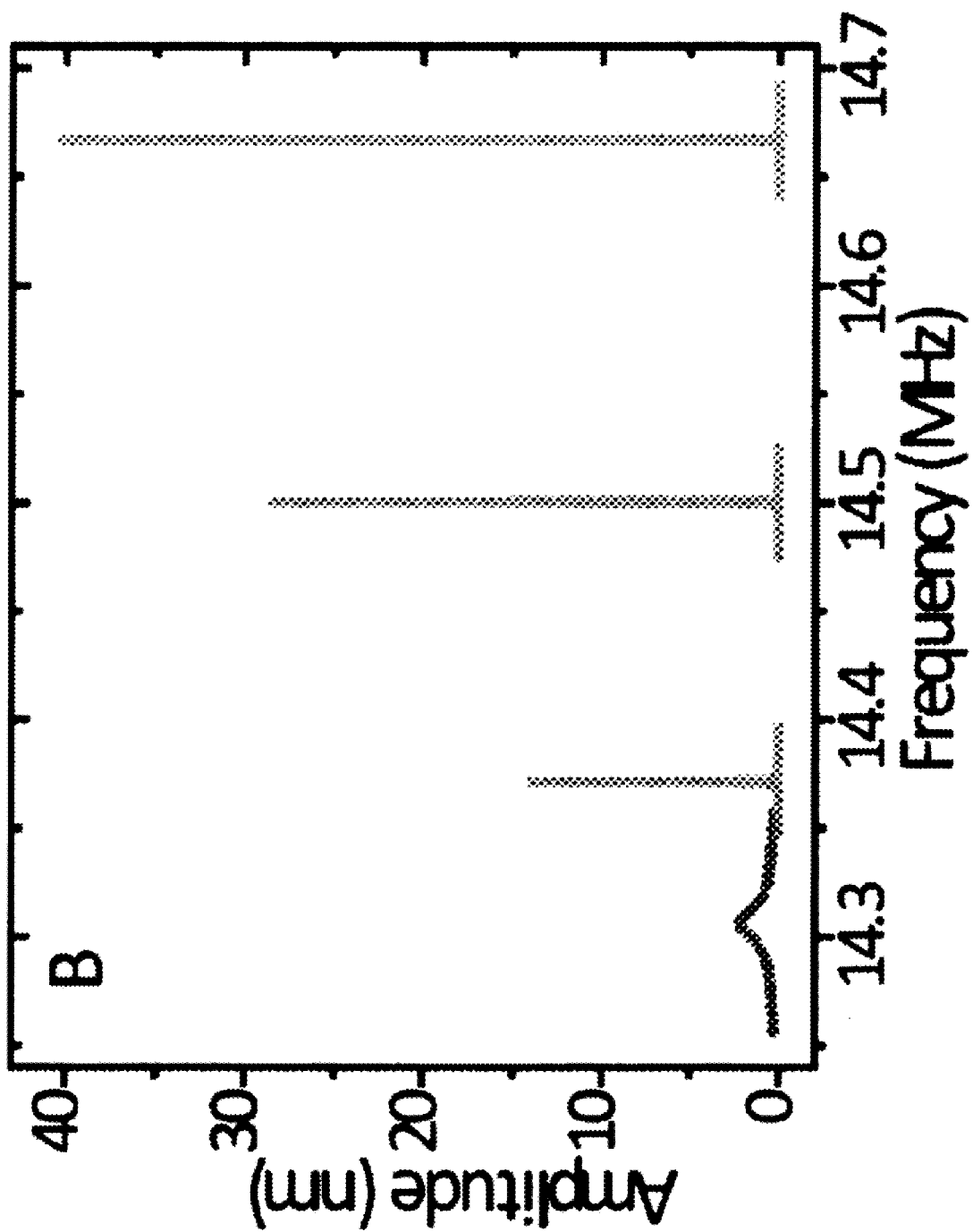
FIG. 12B shows a graph of the spectral response of the oscillator for three different values of φ together with the frequency response of the open loop resonator.
Figures 12C, 12D:
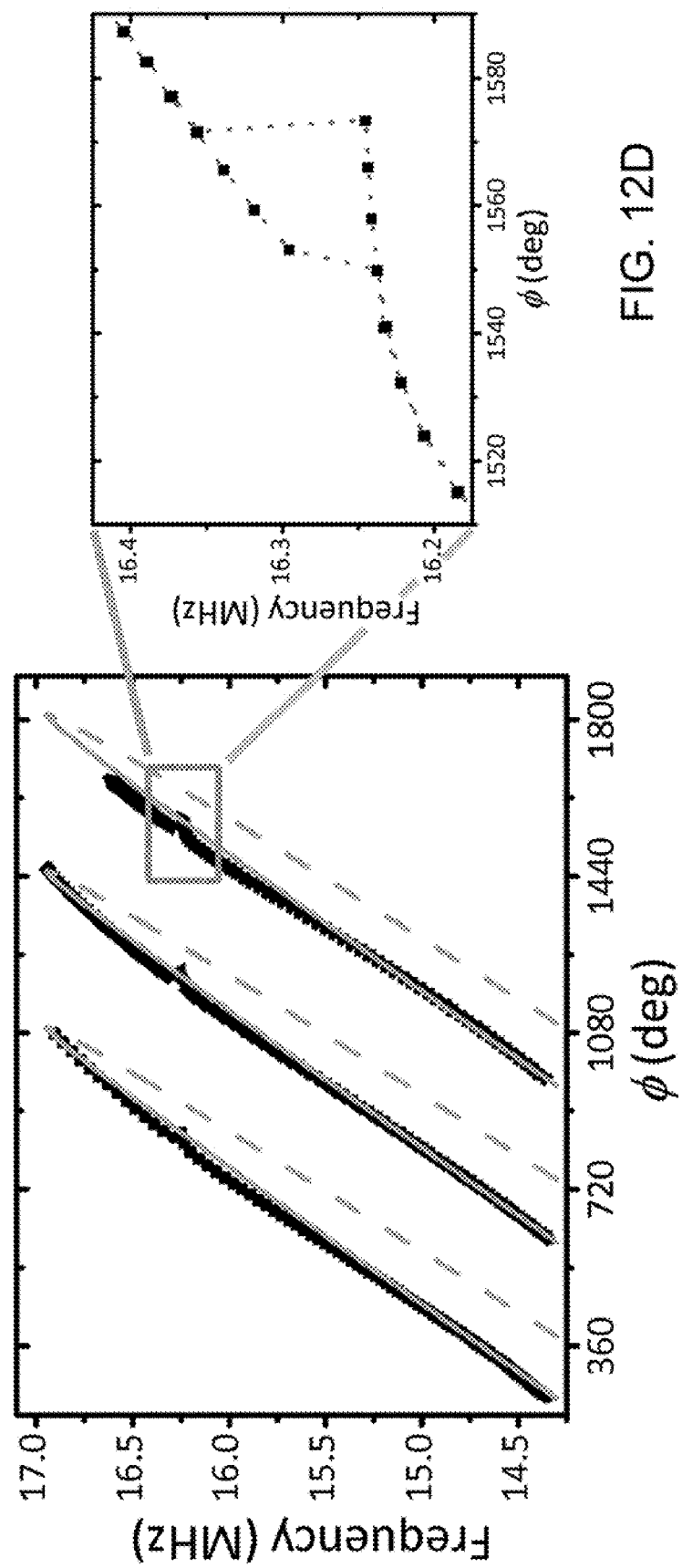
FIG. 12C is a graph which shows the experimental results in terms of a dependence of PFO frequency on φ.
FIG. 12D is a detail of the graph shown in FIG. 12C highlighting a flattening feature.

We now turn to the oscillator's behavior as a function of the phase shift $\phi$. FIG. 12B shows a graph of the spectral response of the oscillator for three different values of $\phi$ (phase increment $\approx 10°$, resulting in a frequency shift of $\approx 14$ kHz/deg). FIG. 12B also shows an open loop resonator response at 20 mV drive, for comparison. Our theoretical analysis predicts a strong dependence on $\phi$ of both frequency and amplitude. We experimentally verified those predictions by monitoring the oscillation frequency while quasistatically changing the voltage controlled phase shift. FIG. 12C is a graph which shows the experimental results in terms of a dependence of PFO frequency on $\phi$. FIG. 12C shows a relatively large tunability range of almost 18% (14.35 to 16.9 MHz), which is useful, for example, for applications involving voltage controlled oscillators and for the potential synchronization of coupled oscillators. Such a wide tuning range is a direct consequence of using parametric feedback because, as shown in FIG. 10E, FIG. 10F, and FIG. 10G, parametric frequency pulling is more efficient than direct-drive pulling. The phase shift range accessible in our experiment is about 1400°, thus we are able to obtain oscillation for several values of $\phi$, separated by 360° from each other. We show three of those experimentally measured tunability branches along with the prediction from our theoretical analysis (part in dashed and dotted lines) in FIG. 12C, demonstrating good quantitative agreement between theory and experiment.

A more detailed inspection of the experimental results revealed a flattening of the frequency versus phase data which deviated from our initial theoretical model. A flattening of the tunability curve close to 16.2 MHz appears in all three branches of FIG. 12C, showing an interaction of the oscillator with a different mechanical mode in the beam. FIG. 12D is a graph showing more detail of the flattening for the third branch. This flattening occurred around 16.2 MHz and could be observed in all three of the branches presented in FIG. 12C. We attribute this feature to the coupling of the oscillator with the first in-plane vibrational mode located at ~32.4 MHz at that particular operating point. By including interaction to a mode at 32.4 MHz into the theoretical analysis, we obtain the predictions which qualitatively matched our experiment. From implementations such as the one described herein above, we realized that a parametric feedback oscillator can be so configured to operate substantially at a flattening point of the curve of frequency $\omega_0$ as a function of the phase shift caused by the phase shifter.

In order to characterize and quantify the performance of a parametric oscillator used as a frequency source or time reference, we measured its frequency stability. We observed that the PFO's phase noise did not change significantly with $\phi$. The graph of FIG. 12F shows the phase noise at a 1 kHz offset, which shows little dependence on $\phi$ except for a region close to the flattening feature described previously and shown in FIG. 12C and FIG. 12D, where a reduction of 15 dBc is observed.

We believe this indicates that the phase noise of our system is dominated by fluctuations in the feedback phase. If this is the case, phase noise should be proportional to the slope of the tunability data as shown by the graph of FIG. 12C. As a first approximation, this slope is constant except at the proximity of the flattening, where the slope, as well as the phase noise, are both lower. To compare the performance of a PFO to a direct drive oscillator with a standard architecture of the prior art, based on the same mechanical resonator, we built a linear feedback loop using the same active components. FIG. 12E shows a graph of phase noise measurements of a prior art direct drive oscillator and of our PFO, operating at identical energies, where we observe a significant reduction in the phase noise by using the PFO architecture. Phase noise measurements for our PFO in both a standard case and at the optimum phase value show a reduction of the noise. For comparison, the phase noise of a standard direct-drive oscillator is shown for the same oscillator energy, indicating higher phase noise than PFO over most of the frequency range. Such an improvement is even larger for the optimized operating point, where the reduction is about 25 dBc (at a 1 kHz offset). Therefore, not only does the PFO architecture improve the characteristics of the oscillator, but it also allows for interaction with higher order modes, triggering an even larger reduction of the phase noise. Even though the phase noise of the presented proof of principle implementation is not yet competitive with some state of the art quartz or MEMS oscillators, we believe there is a considerable room for improvement of PFO phase noise characteristics.

In this work, we generalized the concept of self-sustaining oscillators by extending the resonator's operational range to the non-linear regime and by advancing the notion of feedback loop to include transfer functions which are not linearly proportional to the motion. We performed proof of principle demonstration of such a feedback by building an oscillator based on a nonlinear parametrically actuated NEMS doubly clamped beam with the feedback being a quadratic function of resonator motion for small amplitudes. We demonstrated the advantages of this architecture, such as elimination of cross-talk, control of non-linear properties, enormous frequency tunability, and significant phase noise reduction. The PFO architecture can be used by itself, or in combination with any other type of feedback loop, for example using a 1-ω direct drive, thus considerably improving the desired performance characteristics.

Materials and Methods

Exemplary Fabrication Process Flow

Figure 13D:
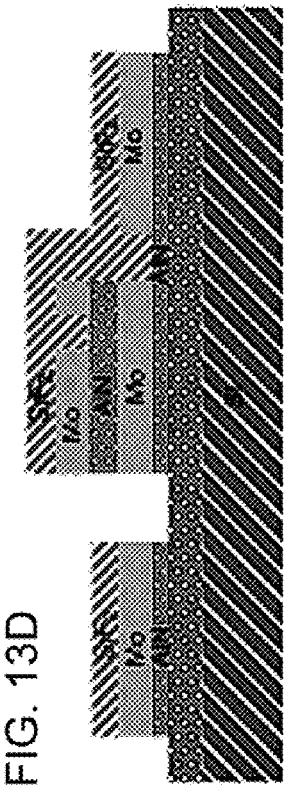
FIGS. 13A through 13F illustrate the steps in fabricating a PFO comprising AlN piezoelectric and Mo electrodes according to principles of the invention.
Figure 13E:
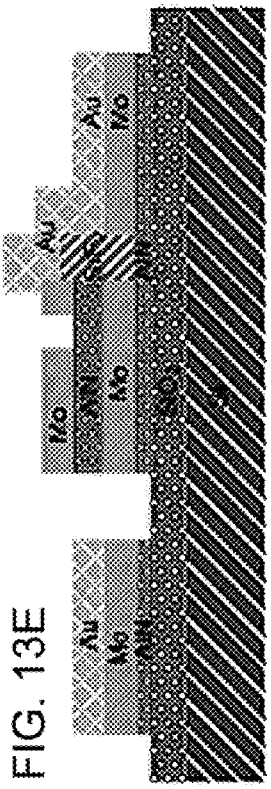
Figure 13F:
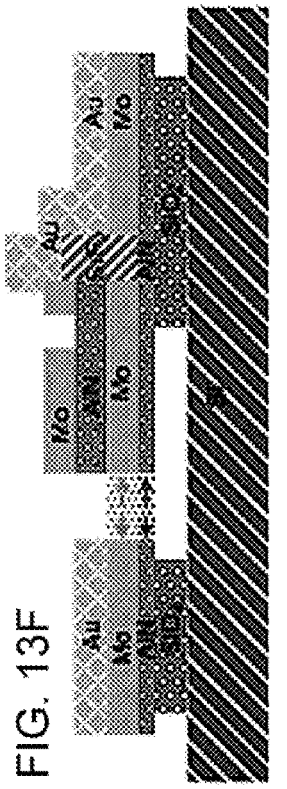
Figure 13A:
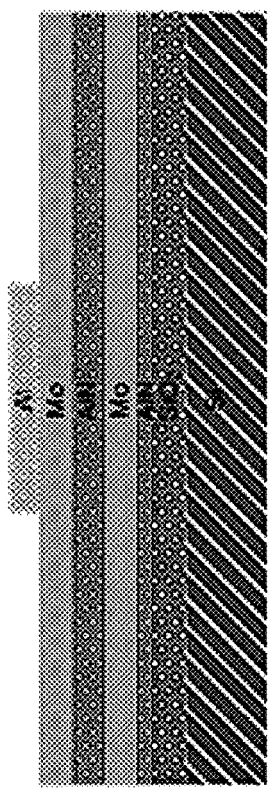
Figure 13B:
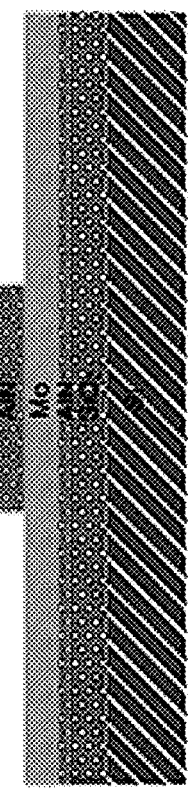
Figure 13C:
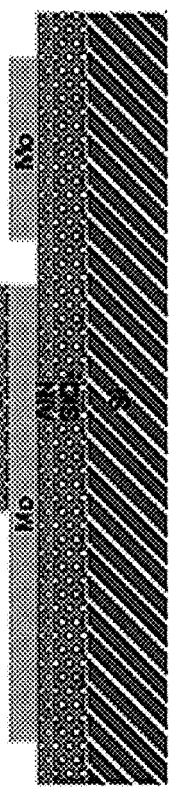

The fabrication of our test devices was performed on dies of a silicon wafer that were prepared with a 2 μm thick layer of $SiO_2$, 20 nm thick AlN seed layer, 100 nm thick Mo, 50 nm thick AlN active layer and 40 nm thick Mo. FIG. 13A to FIG. 13F show a schematic representation of the exemplary process flow. We start by patterning the top Mo layer to define some mesas that are later used for the mechanical devices. FIG. 13A shows the results of the step of depositing an Al thin layer via lift-off with PMMA and performing a dry etching of Mo with $SF_6$. FIG. 13B shows the results of the step of using KOH to remove Al and AlN simultaneously using Mo as a mask for the latter. We perform a dry etch of the two Mo layers in order to define electrical paths, actuation electrodes and piezometallic loops for detection. FIG. 13C shows the results of a two step process using ZEP as a mask and $SF_6$ as the etching species. FIG. 13D shows the results of the step of patterning the mechanical devices using a strontium fluoride ($SrF_2$) mask and chlorine dry etching of the stack. FIG. 13E shows the results of the step of adding a contact the top Mo on the mechanical devices, where we deposit $SrF_2$ isolation "bridges" and, subsequently perform a lift-off of Au, also defining our contact pads. FIG. 13F shows the results of the step of releasing the mechanical structures via a wet etching using buffered HF.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

Constitutive equations

The constitutive equation of motion for a driven and damped parametric anharmonic resonator can be written as:

$$\ddot{x}+\gamma\dot{x}+\omega^2(1+H\cos(2\omega t))x+\alpha x^3+\bar{\eta}x^2\dot{x}=G\cos(\omega t+\phi_g) \quad \text{Eq. 8}$$

where γ is the damping coefficient (inversely proportional to the quality factor Q of the resonator, ω is the natural frequency, α is the non linear stiffness parameter (Duffing coefficient), η is the non linear damping parameter, H is the amplitude of the parametric pumping and G is the amplitude of the direct driving. To understand how a self sustained oscillator (e.g., FIG. 1) of the prior art works, we first cancel the two external energy sources in Eq. 8:

$$\ddot{x}+\gamma\dot{x}+\omega^2 x+\alpha x^3+\bar{\eta}x^2\dot{x}=0 \quad \text{Eq. 9}$$

A common way to produce a stable nontrivial (non-zero) solution for Eq. 9 is to compensate the losses (γ>0) by introducing a positive feedback. This is described by including a negative damping:

$$\ddot{x}-\gamma'\dot{x}+\omega^2 x+\alpha x^3+\bar{\eta}'x^2\dot{x}=0 \quad \text{Eq. 10}$$

where γ' is a parameter which accounts both for the dissipation in the resonator and for the gain in the feedback loop. If γ'>0, then the gain is larger than the dissipation and oscillation occurs. η' accounts for the non linear damping both in the resonator and in the feedback loop (e.g., saturation of amplifier). However, Eq. 10 is not general and only describes a very particular form of feedback. To give a more general description, we can start by rescaling the magnitudes in Eq. 10.

Then, perturbation theory is used considering that the oscillator solution will be given by:

$$x(t)=A(T)e^{i\omega_0 t} \quad \text{Eq. 11}$$

and assuming also that the perturbation A(T) is slow (t>>T≈t/Q) and small in comparison with the characteristic scales of the problem. It is possible to obtain the amplitude equation to describe the oscillator:

$$\frac{dA}{dT}+\frac{1}{2}A-\frac{3i-\eta}{8}|A|^2 A = F(|A|)\cdot e^{i\Delta}\cdot\frac{A}{|A|} \quad \text{Eq. 12}$$

where F (|A|) is the magnitude of the feedback and Δ is the phase of the feedback with respect to the motion of the mechanical structure. Note that for F (|A|)=Γ|A| and Δ=0, Eq. 12 describes the Van der Pohl oscillator given by Eq. 10.

In the case of a PFO, the feedback takes the form F (|A|)∝(|A|³ for small amplitudes and, for large amplitudes, a saturation term should be taken into account. The feedback may be taken to be of the form:

$$F(|A|) = \frac{\Gamma|A|^3}{1+\frac{\Gamma}{S}|A|^2} \quad \text{Eq. 13}$$

where Γ is the gain for small amplitudes and S is the saturation for large amplitudes.

Figure 7:
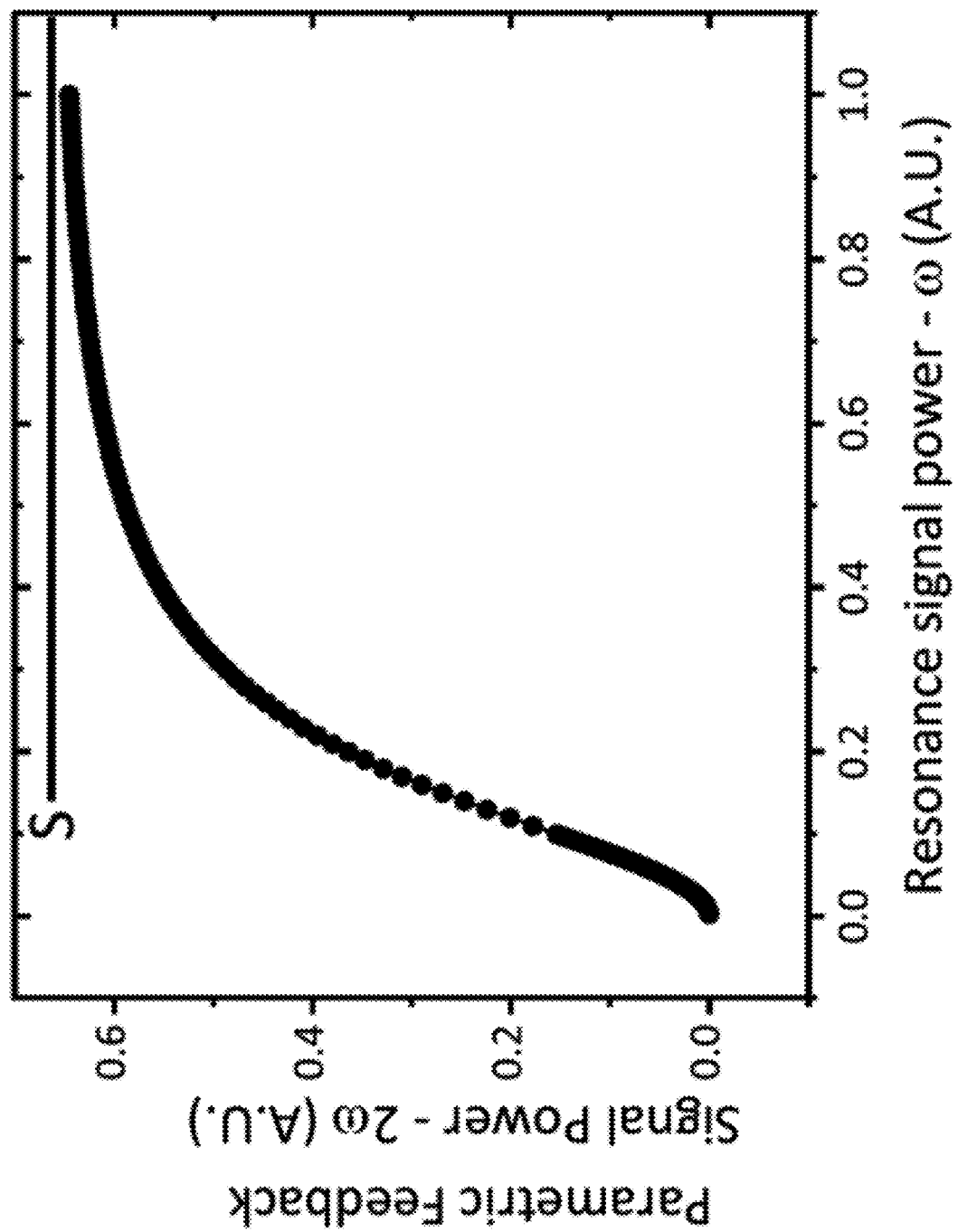
FIG. 7 shows a graph of a typical experimentally measured gain curve for a parametric feedback oscillator plotted as parametric feedback power versus resonance signal power.

FIG. 7 shows a graph of a typical experimentally measured gain curve for a parametric feedback oscillator plotted as parametric feedback power versus resonance signal power. The power of the signal at 2ω (feedback) is plotted versus the power of the signal at ω (mechanical motion).

Using Eq. 12 and Eq. 13, it is possible to write the constitutive equation of a parametric feedback oscillator:

$$\frac{dA}{dT}+\frac{1}{2}A-\frac{3i-\eta}{8}|A|^2 A = \frac{\Gamma}{1+\frac{\Gamma}{S}|A|^2}\cdot e^{i\Delta}\cdot|A|^2 A \quad \text{Eq. 14}$$

This equation shows that the solution A=0 is always stable, which implies that in order to have self-sustained motion, a finite motion should initially exist. In addition, there will be two oscillating solutions, one stable and the other one unstable.

Figure 8A:
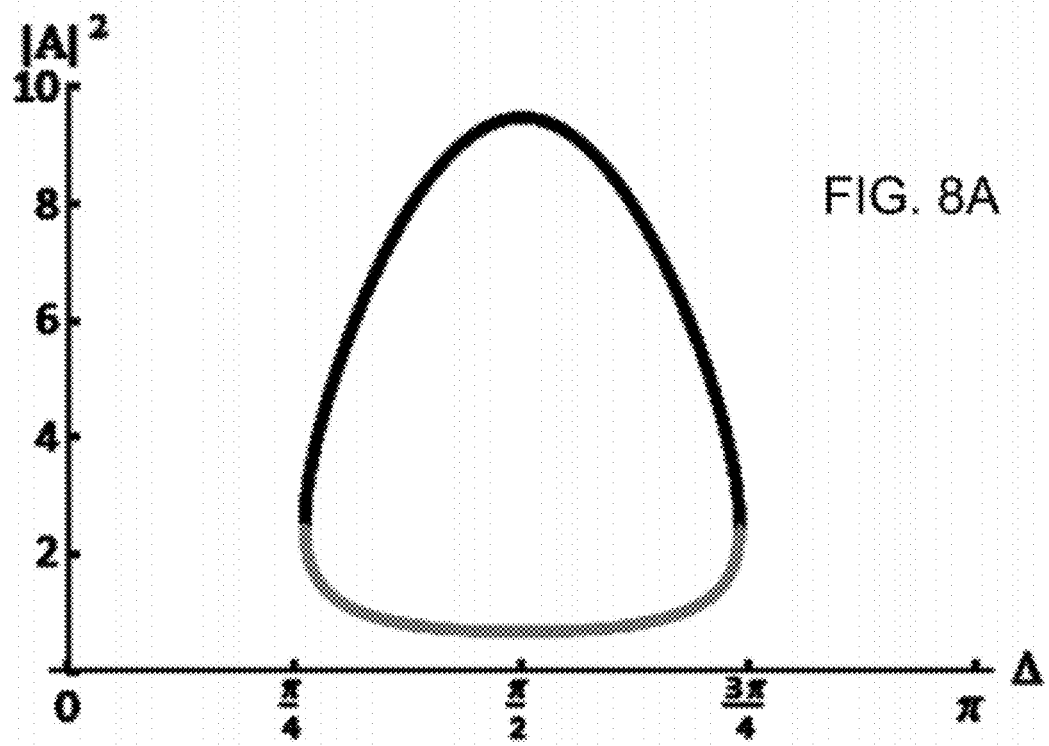
FIG. 8A shows a predicted amplitude of oscillation for a parametric feedback oscillator as a function of the phase shift that is induced within the feedback loop (Δ) for given parameters Γ and S.
Figure 8B:
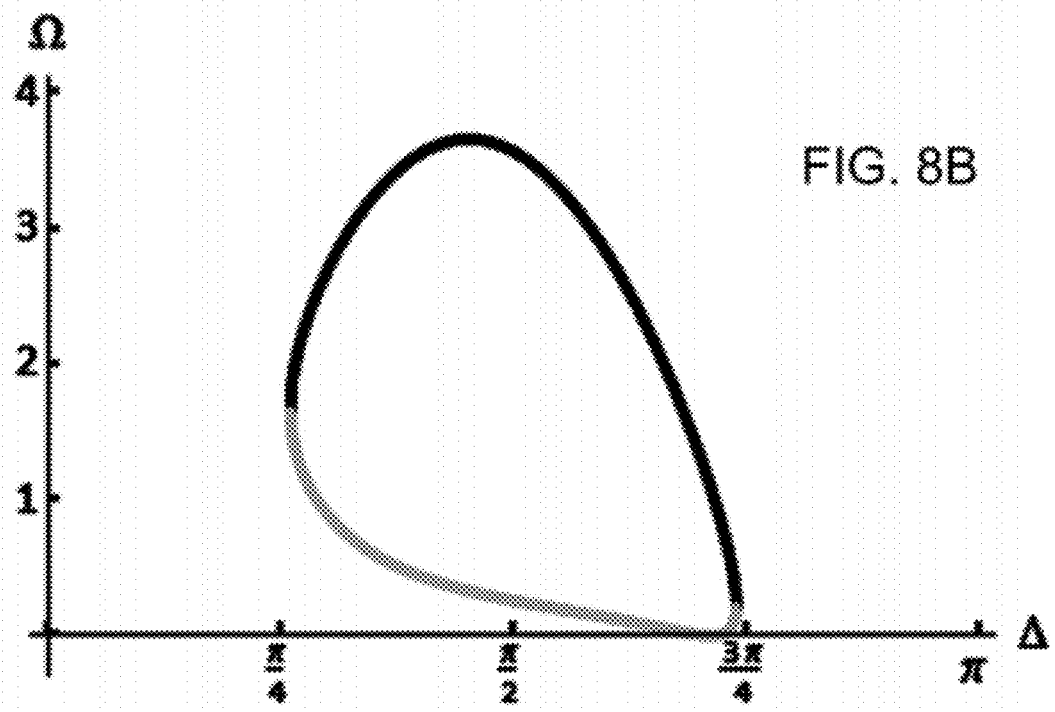
FIG. 8B shows a predicted frequency of oscillation for the parametric feedback oscillator of FIG. 8A.
Figure 9:
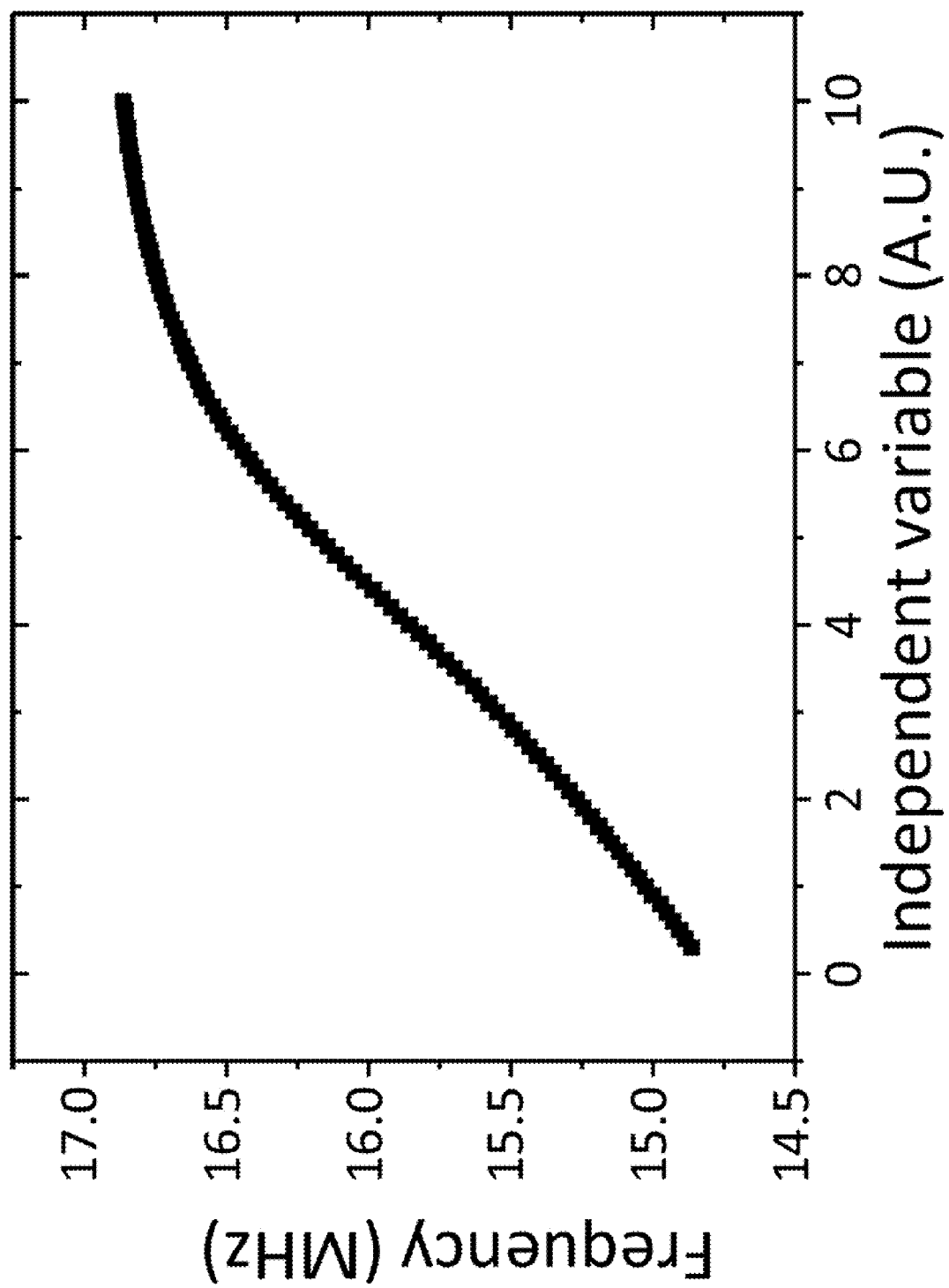
FIG. 9 shows one exemplary graph showing the measured oscillation frequency of a parametric feedback oscillator as a function of a control parameter configured to change the phase shift in the feedback path.

The graphs of FIG. 8A and FIG. 8B show the predicted amplitude (FIG. 8A) and frequency of oscillation (FIG. 8B) for a parametric feedback oscillator as a function of the phase shift that is induced within the feedback loop (Δ) for given parameters Γ and S. The stable branch is marked as a dark curve whereas the unstable branch is marked as a light curve.

The different shades (dark and light) indicate two distinct solution branches, dark for the stable solution and light for the unstable.

We now continue our theoretical analysis in more detail beginning with Eq. 7. To analyze the behavior of Eq. 7, it is convenient to focus on the slow modulations of the resonator oscillations. The displacement of the beam is given in terms of a slowly varying complex modulation function or amplitude A (t) by:

$$x(t) \propto A(t)e^{i\omega_0 t} + \text{c.c.} + \ldots \qquad \text{Eq. 15}$$

with $\omega_0$ the resonant frequency of the beam. The ... in Eq. 15 represent higher order harmonics which will be small for the range of oscillation amplitudes we are going to consider, and will be neglected from hereon. The squared, amplified, $2\omega$-filtered, phase shifted feedback signal is $$\tilde{F} = F(|A|^2)A^2 e^{i\Delta} e^{i2\omega_0 t} + \text{c.c.} \qquad \text{Eq. 16}$$

with F(y) the gain function of the amplifier filter circuit that we take to be:

$$F(y) = \frac{\Gamma}{1 + \left(\frac{\Gamma}{S}\right)y} \qquad \text{Eq. 17}$$

This gives a linear gain Γ of the squared signal at small amplitudes, and at large amplitudes $F(y) \to s/y$ so that the feedback signal takes on the saturated value $$\tilde{F} = s \cdot e^{i(\theta(T) + \Delta)} e^{i2\omega_0 t} + \text{c.c.} \qquad \text{Eq. 18}$$

with θ the phase of A and s the saturation amplitude of the amplifier. The feedback is applied multiplicatively to the displacement of the beam. Keeping the resonant terms at $e^{i\omega_0 t}$ gives the amplitude equation describing the resonator and parametric feedback system:

$$\frac{dA}{dT} = -\frac{1}{2}A + \frac{1}{8}[F(|A|^2)ie^{i\Delta} + 3i - \eta]|A|^2 A \qquad \text{Eq. 19}$$

Here we have introduced the slow scaled time $T = \omega_0 t/Q$ so that times are measured in units of the inverse line width of the linear resonator. The term $-\frac{1}{2}A$ on the right hand side of Eq. 19 is the linear decay rate of undriven oscillations in the resonator in these units. The proportionality constant in Eq. 15 is chosen so that the frequency shift due to the nonlinearity in the resonator is $\frac{3}{8}|A|^2\omega_0/Q$ which means that the amplitude for the onset of bistability in the driven response of the resonator is $$|A|_c^2 = \frac{8}{3}\frac{1}{\sqrt{3} - \eta}.$$

The term depending on η arises from the nonlinear dissipation. For a system with direct sinusoidal drive, such as to initiate the oscillations or the setup studied in FIG. 11, there would be an additional term on the right hand side of Eq. 19: $ge^{i\Omega T}$ with Ω the frequency of the drive relative to the linear resonant frequency expressed in units of the resonance line width.

Figure 14:
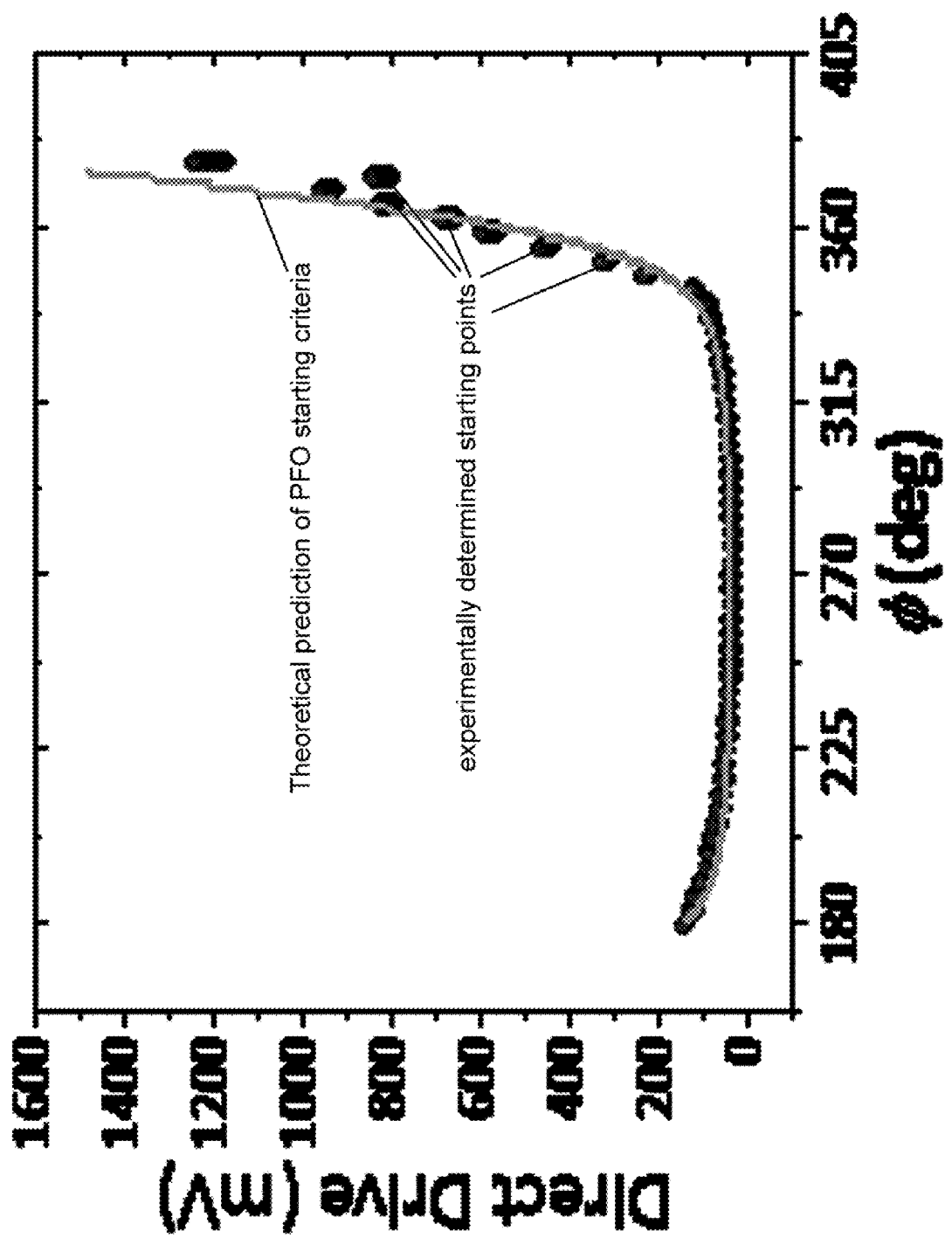
FIG. 14 shows a graph of the theoretical prediction for the starting criteria and experimentally determined starting points shown as scattered data.

For small amplitudes of feedback, the gain function will be in the linear regime. In this case the nonlinear term in Eq. 19 becomes:

$$\frac{1}{8}[i(3 + F(|A|^2))\cos(\Delta)) - (\eta + F(|A|^2)\sin(\Delta))]|A|^2 A \qquad \text{Eq. 20}$$

so that the feedback circuit can be used to tune either the nonlinear frequency pulling or the nonlinear dissipation of the resonator depending on the choice of feedback phase Δ, as demonstrated in FIG. 14.

For sufficiently strong feedback, Eq. 19 supports sustained oscillations. Although it can be straightforward to solve the equation in general, in the experimental setup once the oscillations develop, the feedback system is almost always in the limit of saturated gain function. We illustrate the results for this case. This case corresponds to setting $F(|A|^2)|A|^2 \to s$. Note that this corresponds to parametric drive with fixed amplitude, as in usual parametric experiments, but with a phase given by the signal phase plus the additional phase from the feedback loop. In the present case, the parametric drive comes from the feedback of the amplified output of the resonator, and not from an external a.c. drive signal.

For self-sustained oscillations we set $A(T) = a(T)e^{i\theta(T)}$ and use Eq. 19 to find equations for the amplitude and phase:

$$\frac{da}{dT} = -a\left(\frac{1}{2} + \frac{1}{8}s\sin(\Delta)\right) - \frac{1}{8}\eta a^3 \qquad \text{Eq. 21}$$

$$\frac{d\theta}{dT} = \frac{1}{8}s\cos(\Delta) + \frac{3}{8}a^2 \qquad \text{Eq. 22}$$

Note that the term amplifying the magnitude is proportional to $s \sin(\Delta)$, so that for some values of Δ and for large enough s, the feedback gain can overcome the linear dissipation and can bring the system into oscillation. For steady state oscillation $$\frac{da}{dT} = 0s,$$

$$\frac{d\theta}{dT} = \Omega.$$

This gives the frequency of oscillations:

$$\Omega = \frac{3}{8}s\bar{\eta}^{-1}\sin(\Delta + \delta) - \frac{3}{2}\eta^{-1} \qquad \text{Eq. 23}$$

providing $s \sin(-\delta) > 4$, with $\bar{\eta}^{-2} = \eta^2 + \frac{1}{9}$ and $$\tan(\delta) = \frac{\eta}{3}.$$

The parameter η is the nonlinear damping, and is expected to be small, so we can approximate $\bar{\eta} \approx \eta$ and $\delta \approx 0$.

In our exemplary experimental implementation, the feedback phase shift Δ has a frequency dependent component from the filters in addition to the voltage controlled value ϕ. Over the tuning range of the oscillator this can be approximated as linear so that $$\Delta \approx \phi - c\Omega \qquad \text{Eq. 24}$$

where we find $c \approx \frac{1}{53}$. Eq. 23 and Eq. 24 were used to construct the theory curves in FIG. 12C.

We can also analyze the stability of the steady state oscillations, and the effect of additional noise terms in the equation of motion. It is convenient to write Eq. 21 and Eq. 22 in the general form $$\frac{da}{dT} = f_a(a, \Delta) \quad \text{Eq. 25}$$

$$\frac{d\theta}{dT} = f_\theta(a, \Delta) \quad \text{Eq. 26}$$

and we generalize the feedback phase Eq. 24 to $$\Delta \simeq \phi - c\frac{d\theta}{dT} \quad \text{Eq. 27}$$

The equations for the stability analysis about a steady oscillation are $$\frac{d\delta a}{dT} = \frac{\partial f_a}{\partial a}\delta a + \frac{\partial f_a}{\partial \Delta}\delta\Delta \quad \text{Eq. 28}$$

$$\frac{d\delta\theta}{dT} = \frac{\partial f_\theta}{\partial a}\delta a + \frac{\partial f_\theta}{\partial \Delta}\delta\Delta \quad \text{Eq. 29}$$

Using Eq. 27 we can evaluate $\delta\Delta$ in terms of $$\frac{d\delta\theta}{dT},$$

and then calculate $$\frac{d\delta\theta}{dT}$$

in terms of $\delta\alpha$ from Eq. 29. Substituting into Eq. 28 then gives $$\frac{d\delta\theta}{dT} = \left[\frac{\partial f_a}{\partial a} - c\frac{\partial f_a}{\partial \Delta}\frac{\frac{\partial f_\theta}{\partial a}}{1 + c\frac{\partial f_\theta}{\partial \Delta}}\right]\delta a \quad \text{Eq. 30}$$

The oscillations are stable (unstable) if the term in the braces is negative (positive). On the other hand the steady state amplitude-phase shift curve is determined by $$\frac{da}{d\phi} = -\left[\frac{\partial f_a}{\partial a} - c\frac{\partial f_a}{\partial \Delta}\frac{\frac{\partial f_\theta}{\partial \alpha}}{1 + c\frac{\partial f_\theta}{\partial \Delta}}\right]^{-1}\frac{\partial f_a}{\partial \Delta}\left(1 - \frac{c\frac{\partial f_\theta}{\partial \Delta}}{1 + c\frac{\partial f_\theta}{\partial \Delta}}\right) \quad \text{Eq. 31}$$

The quantity in the braces in Eq. 30 and Eq. 31 is the same. Thus, the change from stability to instability occurs when $$\frac{da}{d\phi} = \infty,$$

i.e. at the "nose" of the $\alpha(\phi)$ curve. $d\Omega/d\phi$ is also infinite here, so the instability can also be identified as the nose of the $\Omega(\phi)$ curve.

Various different noise sources can be considered in the experiment, for example, noise from the feedback amplifier or other electronic noise, and thermomechanical noise in the resonator. These noise sources can be modeled by adding appropriate stochastic terms to Eq. 19. One significant noise term is likely to be phase noise in the feedback loop, which can be modeled by adding a stochastic term to the feedback phase $\Delta$, and it is particularly straightforward to analyze the effect of this term for frequency offsets from oscillator frequency small compared with the dissipative relaxation rate of the resonator.

The analysis for oscillator phase noise arising from noise in the feedback phase is similar. The equations for small fluctuations are the same as Eq. 28 and Eq. 29, with $\delta\alpha$, $\delta\theta$, $\delta\Delta$ now the stochastic fluctuations.

For frequency offsets from the oscillator frequency less than $$\left(\frac{\partial f_a}{\partial a}\right)^{-1}$$

we can ignore the time derivative term in Eq. 28. This means we can calculate an explicit equation for the oscillator phase fluctuations:

$$\frac{d\delta\theta}{dT} = \left(\frac{\partial f_a}{\partial a}\right)^{-1}\left[\frac{\partial f_\theta}{\partial \Delta}\frac{\partial f_a}{\partial a} - \frac{\partial f_\theta}{\partial a}\frac{\partial f_a}{\partial \Delta}\right]\delta\Delta = \frac{d\Omega}{d\Delta} \quad \text{Rq. 32}$$

The last equality follows by direct calculation, and is physically obvious since we are treating the magnitude as adiabatically following the feedback phase fluctuations. Thus, we see that for operating points where the $\Omega(\Delta)$ curve is flat, or, including the frequency dependent phase Eq. 24, where $\Omega(\phi)$ is flat, there is substantially no oscillator phase noise due to noise in the feedback phase. This result is analogous to that of Greywall and Yurke for an oscillator based on a nonlinear (Duffing) resonator with a 1-ω direct drive feedback system, with the operating point chosen to be at the critical amplitude of the resonator for the onset of bistability.

Now, turning to a parametric feedback oscillator threshold criterion, let us assume that we have a system with a feedback loop as the one described above and that we introduce a force to directly drive the resonator into motion ($g\,e^{i\Omega T}$). To solve our system, we assume that the solution will be of the type:

$$A(T) = A_r e^{i\Omega T} + A_o e^{i\Omega_o T} \quad \text{Eq. 33}$$

Where the first term represents the response of the resonator to the external drive (at frequency $\Omega$) and the second term represents the self-sustaining solution at a frequency ($\Omega_o$) that will be determined by the equation of motion (similarly to Eq. 23). If $\Omega_0 \neq \Omega$, which happens most of the time, we obtain two amplitude equations, one for each frequency:

$$dA_r = -\frac{1}{2}A_r + \frac{1}{8}[F(|A|^2)ie^{i\Delta} + 3i - \eta](|A_r|^2 + 2|A_O|^2)A_r + \frac{g}{2}e^{i\Omega T} \quad \text{Eq. 34}$$

$$\frac{dA_O}{dT} = \quad \text{Eq. 35}$$
$$-\frac{1}{2}A_O + \frac{1}{8}[F(|A|^2)ie^{i\Delta} + 3i - \eta](|A_O|^2 + 2|A_r|^2)A_O$$

From Eq. 35, it is possible to see that $A_o = 0$ is a stable solution (there is no self-sustained oscillation) unless the following condition is held:

$$|A_r|^2\left(\eta + \frac{\Gamma}{1+\left(\frac{\Gamma}{S}\right)|A_r|^2}\sin(\Delta)\right) < -2 \qquad \text{Eq. 36}$$

Using the limit case in Eq. 34 and Eq. 36, we can estimate the desired harmonic drive at, for example, the natural frequency of the resonator ($f_0$), which is:

$$g^2 = \frac{|A_r|^4}{16}\left(3 + \frac{\Gamma}{1+\left(\frac{\Gamma}{S}\right)|A_r|^2}\sin(\Delta_0)\right)^2 + \qquad \text{Eq. 37}$$

$$\left(1+|A_r|^2\left(\eta + \frac{\Gamma}{1+\left(\frac{\Gamma}{S}\right)|A_r|^2}\sin(\Delta_0)\right)\right)^2$$

FIG. 14 shows a graph of the theoretical prediction for the starting criteria and experimentally determined starting points shown as scattered data.

Turning now to a theoretical modeling of the flattening feature, we model the flattening feature depicted in FIG. 12C, by supposing that the feedback to the oscillating mode is reduced by absorption into a directly driven second spatial mode of the resonator when the frequency of this mode is resonant with the $2\omega$ feedback. To take this into account we reduce the saturated feedback s by a resonant absorption term making the replacement in Eq. 23

$$s \to s\left(1 - \frac{\lambda\left(\frac{f_2}{2Q_2}\right)^2}{(2f-f_2)^2+\left(\frac{f_2}{2Q_2}\right)^2}\right) \qquad \text{Eq. 38}$$

Here $f_2$, $Q_2$ are the resonant frequency and quality factor of the second mode, and $\lambda$ a constant depending on the coupling of the drive system to this mode.

Figure 15:
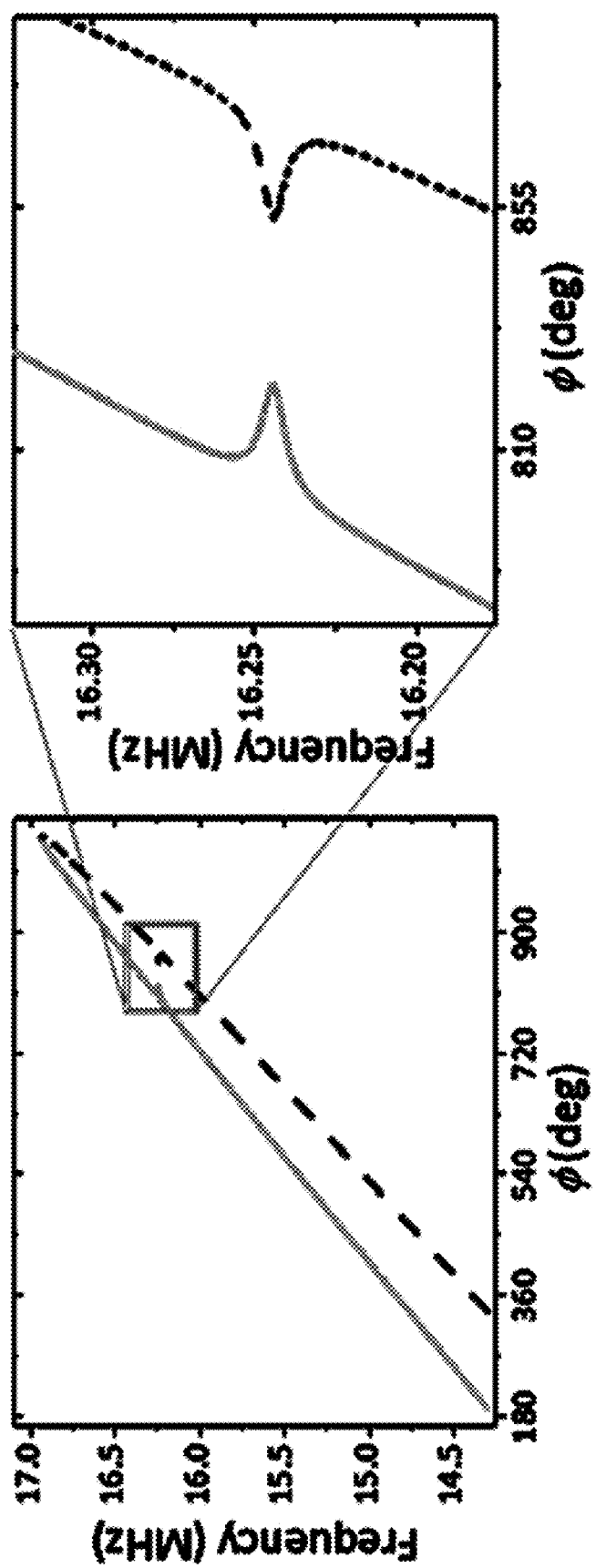
FIG. 15A shows a graph of a theoretical prediction of PFO frequency as a function of externally controlled phase shift.
FIG. 15B shows a magnified portion of the graph of FIG. 15A.

FIG. 15A shows a graph of a theoretical prediction of PFO frequency as a function of externally controlled phase shift including the effect of a second mechanical mode with a natural frequency around 32.5 MHz. FIG. 15B shows a magnified portion of the graph of FIG. 15A, the result of this expanded theoretical model, where the flattening feature can be observed around 16.25 MHz.

Figure 16:
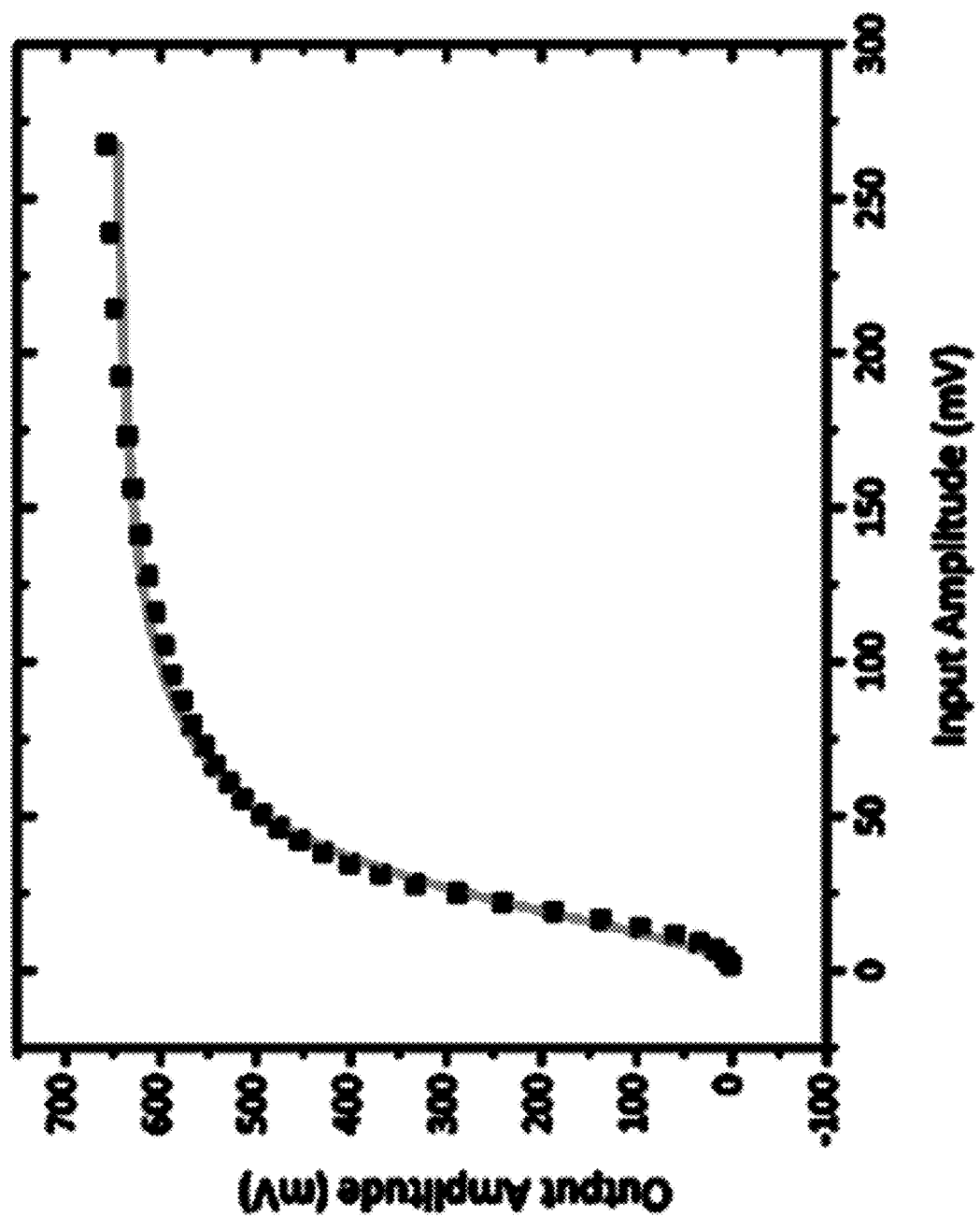
FIG. 16 shows a graph of an experimental plot (scattered data) of the output amplitude after the nonlinear element (monitored at 2ω) as a function of the input amplitude (at ω).

Turning now to an experimental characterization of nonlinear element, we characterize experimentally the transfer function of the nonlinear element in the feedback loop presented in FIG. 11A. To do that, we send a signal to the nonlinear element at a frequency $\omega$ and monitor the power transferred at $2\omega$. The result is presented in the graph of FIG. 16. FIG. 16 shows a graph of an experimental plot (scattered data) of the amplitude after the nonlinear element (monitored at $2\omega$) as a function of the input amplitude (at $\omega$). The continuous line represents the nonlinear fitting of our experimental data to a function of the type described in Eq. 17.

Figure 17:
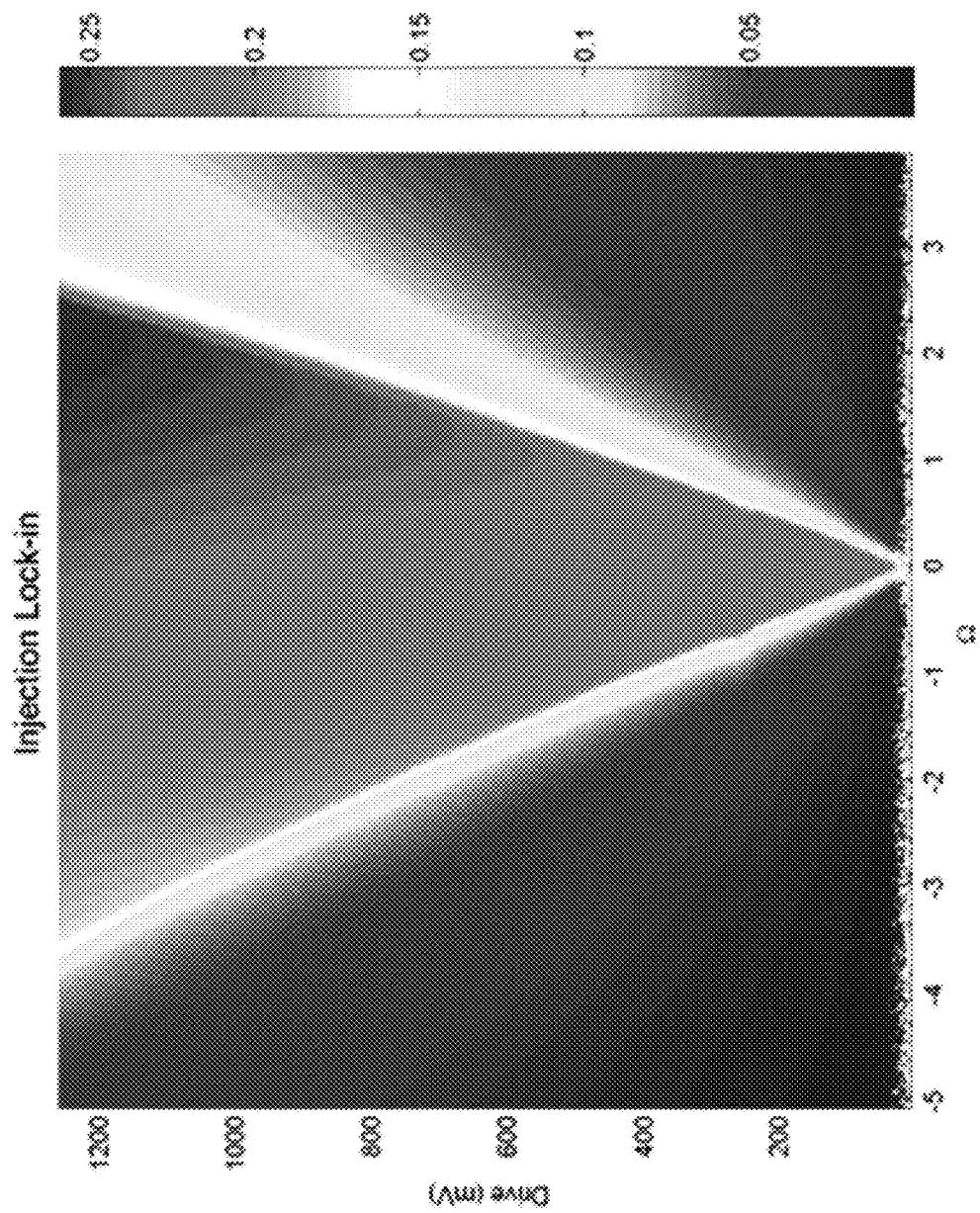
FIG. 17 shows a graph of the injection lock-in tongue.

Turning now to the "injection lock-in tongue", one of the most striking features of self-sustaining oscillators is that when an external force is applied to them, they are able to lock to that external force, provided the frequency detuning is low and/or the force is large. FIG. 17 shows a graph of the injection lock-in tongue. The outer side zones represent regions where the oscillator does not lock to the force and the inner triangular region represents a zone in which the oscillator does lock. The lock-in range increases almost linearly with applied drive. Behavior at high drive, amplitude and detuning deviates from linearity.

Turning now to the thermal limit of the phase noise, the fundamental noise limit of any mechanical oscillator is set by its thermomechanical noise. If we consider a mechanical oscillator which is limited by that noise, the phase noise can be estimated via Leeson's formula to be:

$$\mathcal{L}(\Delta\omega) = 10\log\left(\frac{k_B T}{E_{OSC}\omega Q}\frac{1}{\Delta\omega^2}\right) \qquad \text{Eq. 39}$$

Figure 18:
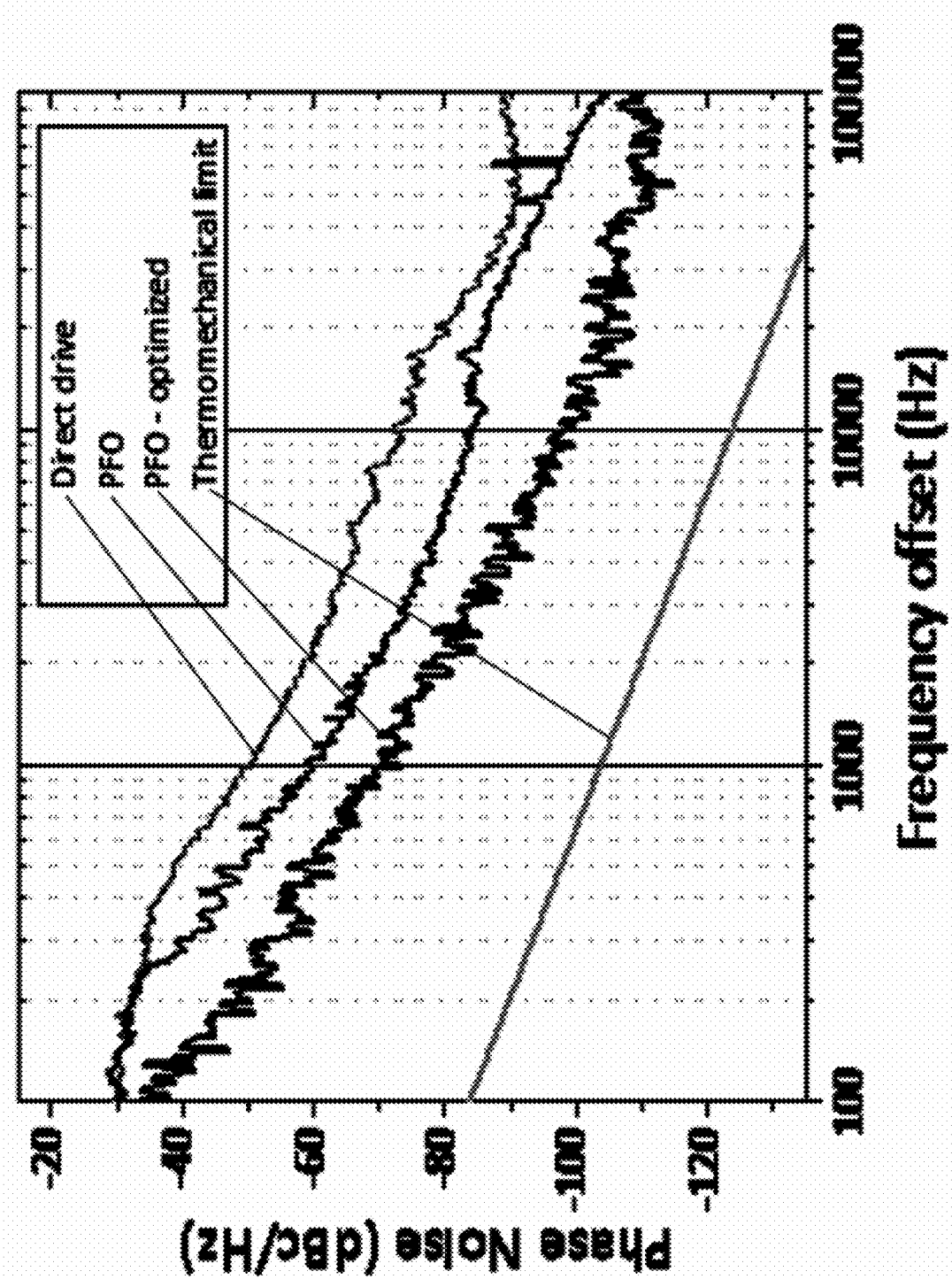
FIG. 18 shows the results of experimental phase noise measurements and the thermomechanical limit.

Now we can re-plot the results shown in FIG. 12E together with the fundamental limit of the system shown in the graph of FIG. 18. FIG. 18 shows the experimental phase noise measurements and the thermomechanical limit.

Definitions

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware. For example, a transfer function of a non-linear element can be implemented in any suitable technology, including one or more microcomputers, processors and/or in software running on any suitable hardware.

As used herein, the meaning of "A is coupled to B" or "A coupled to B" is that either A and B are connected to each other, or that, although A and B may not be directly connected to each other, there is nevertheless a device, a circuit element or a circuit that is connected to both A and B. This device, circuit element or circuit can include active or passive circuit elements, or any combination thereof Any passive circuit elements can be either of a distributed or a lumped-parameter nature. For example, A can be connected to a circuit element that in turn is connected to B.

As used herein the term "microelectromechanical" refers to physical structures that have dimensions measured in units of microns (e.g., from approximately 1 micron to approximately 1000 microns), and the term "nanoelectromechanical" refers to physical structures that have dimensions measured in units of nanometers (e.g., from approximately 1 nanometer to approximately 1000 nanometers).

As used herein the term "terminal" means any type of connection point. For example, an element, substructure, or component (e.g., an integrated component) can have terminals internal to a circuit structure (e.g., an integrated circuit structure). A terminal can also represent a physical connection point for connecting a circuit or device to another circuit or device, such as a pad on an integrated structure or a pin on a physical circuit package. Where a terminal is configured to accept a source of power (e.g., a power supply), it is understood that there are generally at least two wired connections (e.g., a power supply voltage and a reference voltage which is typically, but not necessarily, a "common" connection). A reference voltage for a power supply connection can also be made to a substrate, such as the substrate of an integrated structure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A parametric feedback oscillator, comprising:
   a power input terminal configured to accept a source of electrical power;
   a resonator having at least one transduction element and at least one electromechanical resonating element, said electromechanical resonating element configured to accept as input a parametric excitation signal at a frequency $2\omega_0$ and to provide a resonating output signal at a frequency $\omega_0$;
   a cascaded feedback path comprising in any electrically coupled cascade order:
     at least one non-linear element disposed within said cascaded feedback path and coupled to said resonator, said non-linear element configured to receive said resonating output signal at $\omega_0$ and configured to provide a non-linear element output signal at a frequency $2\omega_0$;
     at least one phase shifter electrically disposed within said cascaded feedback path, said phase shifter configured to receive a phase shifter input signal and configured to provide a phase shifted output signal relative to said phase shifter input signal;
     at least one amplifier electrically disposed within said cascaded feedback path, said amplifier configured to receive an amplifier input signal and configured to provide an amplifier output signal comprising an amplified signal relative to said amplifier input signal, and configured to accept electrical power from said power input terminal;

said cascade feedback path configured to receive as input said resonating output signal at a frequency $\omega_0$ and configured to provide as output a feedback path signal as said parametric excitation signal at a frequency $2\omega_0$ to said resonator; and a parametric feedback oscillator output terminal configured to provide said resonating output signal at said frequency $\omega_0$ as an output signal.

2. The parametric feedback oscillator of claim 1, said parametric feedback oscillator configured to operate substantially at a flattening point.

3. The parametric feedback oscillator of claim 2, further comprising an all pass filter.

4. The parametric feedback oscillator of claim 1, wherein said at least one non-linear element comprises a frequency doubler.

5. The parametric feedback oscillator of claim 1, further comprising a directional coupler electrically disposed between said resonator and said at least one non-linear element, said directional coupler having a directional coupler input terminal and a first directional coupler output terminal and a second directional coupler output terminal, said directional coupler input terminal electrically coupled to said resonator, said first directional coupler output terminal configured as a parametric feedback oscillator output terminal, and said second directional coupler output terminal electrically coupled to said non-linear element.

6. The parametric feedback oscillator of claim 1, wherein said resonator comprises a resonator selected from the group consisting of a microelectromechanical resonator and a nanoelectromechanical resonator.

7. The parametric feedback oscillator of claim 6, wherein said resonator comprises at least one beam of a type selected from the group consisting of a clamped-clamped beam, a clamped-free beam, a free-free beam, a square plate resonator, a disk resonator, and a ring resonator.

8. The parametric feedback oscillator of claim 7, wherein said resonator comprises a plurality of said beams.

9. The parametric feedback oscillator of claim 7, wherein said beam comprises at least one of a metal, a semiconductor, an insulator, and a piezoelectric.

10. The parametric feedback oscillator of claim 7, wherein said beam comprises a material selected from the group of materials consisting of a multi-stack of metal-piezoelectric-metal, aluminum, gold, platinum, silicon, silicon nitride, silicon carbide, silicon oxide, molybdenum, aluminum nitride, gallium arsenide, aluminum gallium arsenide, gallium nitride, carbon, zinc oxide, boron nitride, a piezoceramic material, lithium niobate, lithium tantalate, and sodium niobate.

11. The parametric feedback oscillator of claim 1, wherein said resonator is configured to be set in motion by dynamically modulating at least one physical parameter selected from the group consisting of frequency, elastic constant, and mass.

12. The parametric feedback oscillator of claim 11, wherein said dynamic modulation is selected from the group consisting of an actuation effect, a mechanical effect and a geometric effect.

13. The parametric feedback oscillator of claim 12, wherein said mechanical effect is a selected one of a material stress and a material property.

14. The parametric feedback oscillator of claim 12, wherein a geometric effect comprises a change in the geometry or the size of said resonator.

15. The parametric feedback oscillator of claim 1, comprising a selected one of optical actuation nonlinearity effect tuning and capacitive actuation nonlinearity effect tuning.

16. The parametric feedback oscillator of claim 1, wherein said at least one non-linear element comprises a selected one of a digital non-linear element, an analog non-linear element, and a combination thereof.

17. The parametric feedback oscillator of claim 1, wherein said at least one non-linear element is disposed within said resonator.

18. The parametric feedback oscillator of claim 17, wherein said at least one non-linear element comprises a selected one of a readout transduction element and an actuator transduction element.

19. The parametric feedback oscillator of claim 1, wherein said at least one non-linear element comprises a selected one of an actuation transducer and a detection transducer.

20. The parametric feedback oscillator of claim 1, wherein said at least one non-linear element comprises a signal transducer selected from the group consisting of magnetomotive, capacitive, optical, electrostatic, piezoresistive and piezoelectric transducers.

21. The parametric feedback oscillator of claim 1, wherein said at least one non-linear element comprises a signal transducer having a quadratic dependence.

22. The parametric feedback oscillator of claim 1, wherein said at least one non-linear element comprises an analog non-linear device.

23. The parametric feedback oscillator of claim 22, wherein said analog non-linear device comprises a selected one of a diode and a saturated amplifier.

24. The parametric feedback oscillator of claim 23, further comprising at least one high order filter configured to suppress harmonics other than the $2\omega_0$ harmonic.

25. The parametric feedback oscillator of claim 1, wherein said parametric feedback oscillator is configured to be fabricated by a selected one of a micro-fabrication process and a nano-fabrication process.

26. The parametric feedback oscillator of claim 1, wherein said parametric feedback oscillator is fabricated by a selected one of a CMOS process and BiCMOS process.

27. The parametric feedback oscillator of claim 1, comprising multiple feedback loops.

28. The parametric feedback oscillator of claim 1, configured to adjust at least a selected one of a nonlinear stiffness (Duffing) term and a nonlinear damping term.

29. A method of causing a parametric feedback oscillation in a resonator, comprising the steps of:

providing a resonator, a frequency doubler, and an amplifier electrically coupled in a closed loop, said amplifier configured to provide an amplified doubled frequency feedback signal of an output frequency of said resonator to an input of said resonator;

oscillating said nanoelectromechanical resonator at a frequency $\omega_0$;

doubling said frequency $\omega_0$ to create a $2\omega_0$ feedback signal;

amplifying said $2\omega_0$ feedback signal; and applying said amplified $2\omega_0$ feedback signal to said resonator at said frequency $2\omega_0$ to cause a self sustained parametric feedback oscillation at said frequency $\omega_0$.

30. The method of causing a parametric feedback oscillation in a resonator of claim 29, further comprising the step of tuning said frequency $\omega_0$ using a tuning method selected from the group of tuning methods consisting of piezoelectric tuning, thermal tuning, and tuning by application of an externally applied axial force.

31. The method of causing a parametric feedback oscillation in a resonator of claim 30, wherein said method comprises a step selected from the steps consisting of a non-linear capacitive actuation and a non-linear $2\omega$ piezoresistive detection.

32. The method of causing a parametric feedback oscillation in a resonator of claim 29, wherein said resonator comprises a nanoelectromechanical resonator or a microelectromechanical resonator.

33. A parametric feedback oscillator comprising:
- a resonator having a resonator input terminal and a resonator output terminal, said resonator having at least one transducer element;
- a directional coupler having a directional coupler input terminal, a first directional coupler output terminal and a second directional coupler output terminal, said directional coupler input terminal electrically coupled to said resonator output terminal;
- a frequency doubler having a frequency doubler output terminal, said frequency doubler coupled to said resonator via a selected one of an electromechanical connection via said transducer element and an electrical connection to said resonator output terminal;
- a phase shifter having a phase shifter input terminal and a phase shifter output terminal, said phase shifter input terminal electrically coupled to said frequency doubler output terminal;
- an amplifier having an amplifier input terminal and an amplifier output terminal, said amplifier input terminal electrically coupled to said phase shifter output terminal, and said amplifier output terminal electrically coupled to said resonator input terminal;
- at least one power terminal and one common terminal, said power terminal configured to accept a source of electrical power; and
- said resonator configured to oscillate at a frequency $\omega_0$ in response to a feedback signal at $2\omega_0$ and said parametric feedback oscillator configured to generate an output signal having a frequency $\omega_0$.

* * * * *